(12) United States Patent
Chang et al.

(10) Patent No.: US 11,532,512 B2
(45) Date of Patent: Dec. 20, 2022

(54) FIN FIELD EFFECT TRANSISTOR (FINFET) DEVICE STRUCTURE WITH INTERCONNECT STRUCTURE

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 145 days.

(21) Appl. No.: 17/062,822

(22) Filed: Oct. 5, 2020

(65) Prior Publication Data
US 2021/0020496 A1 Jan. 21, 2021

Related U.S. Application Data

(60) Continuation of application No. 16/050,013, filed on Jul. 31, 2018, now Pat. No. 10,796,955, which is a
(Continued)

(51) Int. Cl.
*H01L 21/76* (2006.01)
*H01L 21/768* (2006.01)
*H01L 23/485* (2006.01)
*H01L 29/417* (2006.01)
*H01L 23/522* (2006.01)
(Continued)

(52) U.S. Cl.
CPC .... *H01L 21/7685* (2013.01); *H01L 21/76807* (2013.01); *H01L 21/76811* (2013.01); *H01L 21/76813* (2013.01); *H01L 21/76816* (2013.01); *H01L 21/76826* (2013.01); *H01L 21/76831* (2013.01); *H01L 21/76844* (2013.01); *H01L 21/76846* (2013.01); *H01L 21/76865* (2013.01);
(Continued)

(58) Field of Classification Search
None
See application file for complete search history.

(56) References Cited

U.S. PATENT DOCUMENTS 5,872,053 A 2/1999 Smith
6,040,243 A 3/2000 Li et al.
(Continued)

FOREIGN PATENT DOCUMENTS

DE 112010003659 T5 10/2012
KR 100660915 B1 12/2006
(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A semiconductor device structure and method for forming the same are provided. The semiconductor device structure includes a first metal layer formed over a substrate and a dielectric layer formed over the first metal layer. The semiconductor device structure further includes an adhesion layer formed in the dielectric layer and over the first metal layer and a second metal layer formed in the dielectric layer. The second metal layer is electrically connected to the first metal layer, and a portion of the adhesion layer is formed between the second metal layer and the dielectric layer. The adhesion layer includes a first portion lining with a top portion of the second metal layer, and the first portion has an extending portion along a vertical direction.

20 Claims, 26 Drawing Sheets

Related U.S. Application Data division of application No. 14/813,775, filed on Jul. 30, 2015, now Pat. No. 10,332,790.

(60) Provisional application No. 62/175,849, filed on Jun. 15, 2015.

(51) Int. Cl.
*H01L 23/528* (2006.01)
*H01L 29/66* (2006.01)
*H01L 29/78* (2006.01)
*H01L 23/532* (2006.01)

(52) U.S. Cl.
CPC ...... *H01L 21/76877* (2013.01); *H01L 23/485* (2013.01); *H01L 23/528* (2013.01); *H01L 23/5226* (2013.01); *H01L 29/41791* (2013.01); *H01L 29/66795* (2013.01); *H01L 29/785* (2013.01); *H01L 23/53223* (2013.01); *H01L 23/53238* (2013.01); *H01L 23/53295* (2013.01)

(56) References Cited

U.S. PATENT DOCUMENTS

| | | |
|---|---|---|
| 6,156,648 A | 12/2000 | Huang |
| 6,211,068 B1 | 4/2001 | Huang |
| 6,624,066 B2 | 9/2003 | Lu et al. |
| 6,657,304 B1 | 12/2003 | Woo et al. |
| 6,949,461 B2 | 9/2005 | Malhotra et al. |
| 7,119,009 B2 | 10/2006 | Watanabe et al. |
| 7,615,489 B1 | 11/2009 | Fu |
| 7,638,423 B2 | 12/2009 | Lee et al. |
| 7,994,047 B1 | 8/2011 | Woo et al. |
| 8,058,728 B2 | 11/2011 | Ishizaka et al. |
| 8,236,645 B1 | 8/2012 | Chumakov |
| 8,629,058 B2 | 1/2014 | Shue et al. |
| 2002/0110999 A1 | 8/2002 | Lu et al. |
| 2002/0113237 A1 | 8/2002 | Kitamura |
| 2005/0205519 A1 | 9/2005 | Kim et al. |
| 2006/0024953 A1 | 2/2006 | Papa Rao et al. |
| 2006/0073647 A1 | 4/2006 | Inaba |
| 2007/0018224 A1 | 1/2007 | Tu |
| 2008/0251779 A1 | 10/2008 | Kakoschke et al. |
| 2009/0197404 A1 | 8/2009 | Yang |
| 2010/0164530 A1 | 7/2010 | Hoentschel et al. |
| 2010/0301491 A1 | 12/2010 | Yang |
| 2013/0270703 A1 | 10/2013 | Zierath et al. |
| 2014/0264895 A1 | 9/2014 | Sung et al. |

FOREIGN PATENT DOCUMENTS

| | | |
|---|---|---|
| KR | 20060127209 A | 12/2006 |
| WO | 2005091974 A2 | 10/2005 |

FIN FIELD EFFECT TRANSISTOR (FINFET) DEVICE STRUCTURE WITH INTERCONNECT STRUCTURE

CROSS REFERENCE TO RELATED APPLICATIONS

This application is a continuation of U.S. application Ser. No. 16/050,013, filed on Jul. 31, 2018, and entitled "Fin Field Effect Transistor (FinFET) Device Structure with Interconnect Structure," now U.S. Pat. No. 10,796,955, which is a divisional of U.S. application Ser. No. 14/813,775, filed on Jul. 30, 2015, and entitled "Fin Field Effect Transistor (FinFET) Device Structure with Interconnect Structure," now U.S. Pat. No. 10,332,790, which claims the benefit of U.S. Provisional Application No. 62/175,849 filed on Jun. 15, 2015, and entitled "Fin Field Effect Transistor (FinFET) Device Structure with Interconnect Structure," the entirety of which is incorporated by reference herein. This application is related to the following co-pending and commonly assigned patent application: U.S. Application Ser. No. 14/799,258, filed on Jul. 14, 2015, and entitled "Fin Field Effect Transistor (FinFET) Device Structure with Interconnect Structure," now U.S. Pat. No. 9,536,826, the entirety of each is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the fabrication of semiconductor devices, the size of semiconductor devices has been continuously reduced in order to increase device density. Accordingly, a multi-layered interconnect structure is provided. The interconnect structure may include one or more conductive lines and via layers.

Although existing interconnect structures and methods of fabricating interconnect structures have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2P' shows an enlarged representation of region A of FIG. 2P, in accordance with some embodiments of the disclosure.

FIG. 3C' shows an enlarged representation of region B of FIG. 3C, in accordance with some embodiments of the disclosure.

FIG. 3E' shows an enlarged representation of region C of FIG. 3E, in accordance with some embodiments of the disclosure.

FIG. 4C' shows an enlarged representation of region D of FIG. 4C, in accordance with some embodiments of the disclosure.

DETAILED DESCRIPTION

Figure 1:
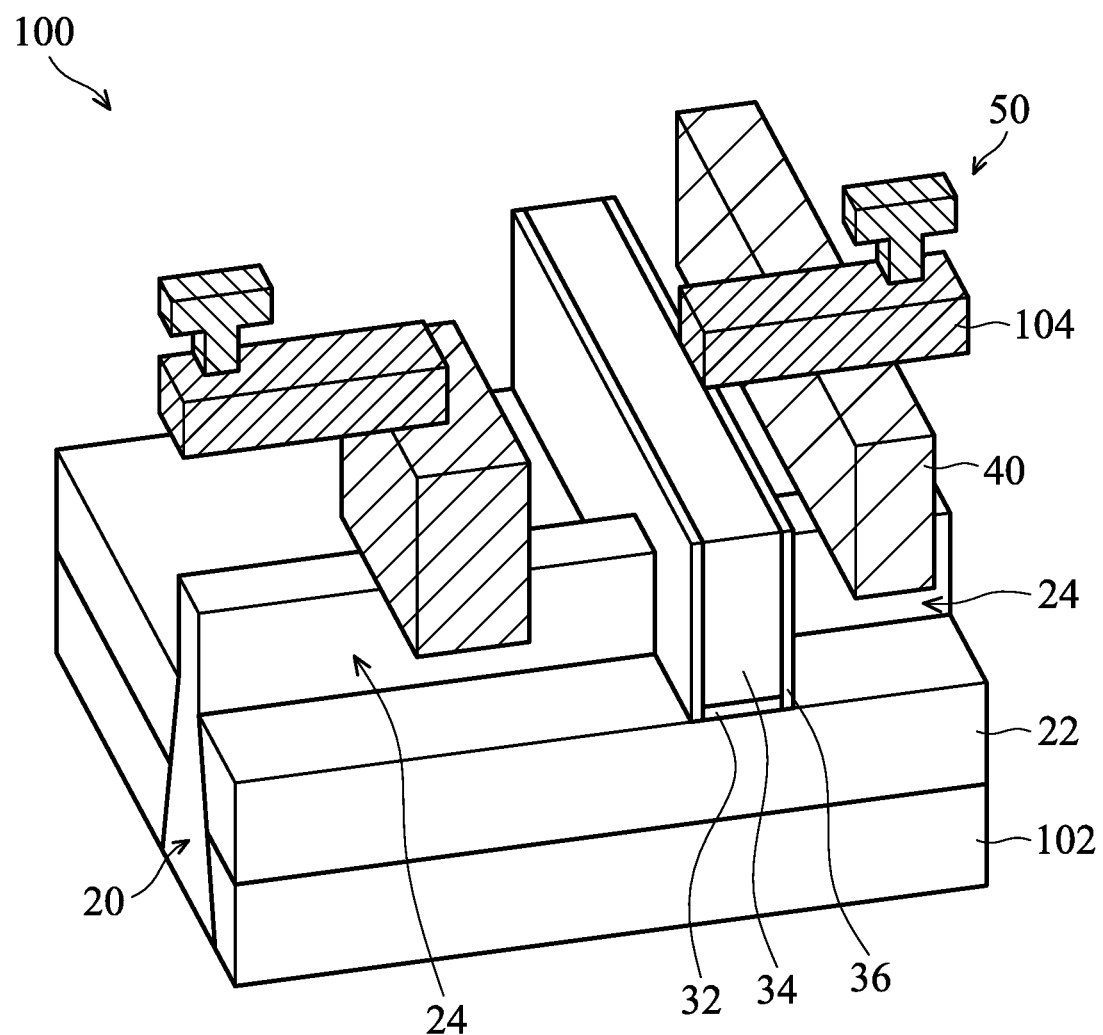
FIG. 1 shows a three-dimensional view of an interconnect structure on a fin field effect transistor (FinFET) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor structure with an interconnect structure are provided. The interconnect structure includes a number of metallization layers formed in a dielectric layer (such as inter-metal dielectric, IMD). One process for forming interconnect structures is the dual damascene process.

FIG. 1 shows a three-dimensional view of an interconnect structure on a fin field effect transistor (FinFET) device structure 100, in accordance with some embodiments of the disclosure.

The FinFET device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The FinFET device structure 100 also includes one or more fin structures 20 (e.g., Si fins) that extend from the substrate 102. The fin structure 20 may optionally include germanium (Ge). The fin structure 20 may be formed by using suitable processes such as photolithography and etching processes. In some embodiments, the fin structure 20 is etched from the substrate 102 using dry etch or plasma processes.

An isolation structure 22, such as a shallow trench isolation (STI) structure, is formed to surround the fin structure 20. In some embodiments, a lower portion of the fin structure 20 is surrounded by the isolation structure 22, and an upper portion of the fin structure 20 protrudes from the isolation structure 22, as shown in FIG. 1. In other words, a portion of the fin structure 20 is embedded in the isolation structure 22. The isolation structure 22 prevents electrical interference or crosstalk.

The FinFET device structure 110 further includes a gate stack structure including a gate dielectric layer 32 and a gate electrode 34. The gate stack structure is formed over a central portion of the fin structure 20. In some other embodiments, the gate stack structure is a dummy gate stack and is replaced later by a metal gate (MG) after high thermal budget processes are performed.

As shown in FIG. 1, spacers 36 are formed on the opposite sidewalls of the gate electrode 34. The source/drain (S/D) structures 24 are formed adjacent to the gate stack structure. The contact structures 40 are formed over the source/drain (S/D) structures 24, and a first metal layer 104 is formed over the contact structure 40. A trench-via structure 50 is formed over the first metal layer 104. A second metal layer (not shown) will be formed on the trench-via structure 50. The trench-via structure 50 is disposed between the first metal layer 104 and the second metal layer and is configured to electrically connect to the first metal layer 104 and the second metal layer.

FIG. 1 is a simplified view of the interconnect structure including a first metal layer and trench-via structure 50 over the fin field effect transistor (FinFET) device structure 100. Some features, such as the inter-layer dielectric (ILD) layer and doped regions, are not shown in FIG. 1.

Figure 2A:
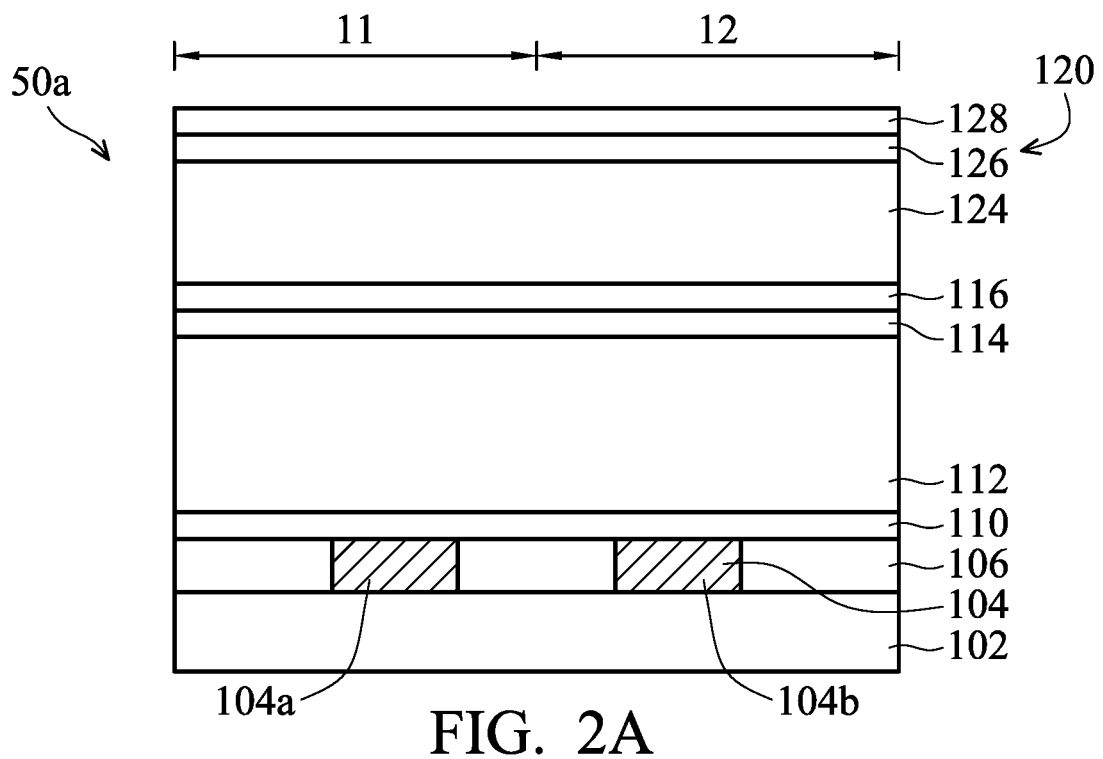
FIGS. 2A-2P show cross-sectional representations of various stages of forming a semiconductor device structure with an interconnect structure, in accordance with some embodiments of the disclosure.
Figure 2B:
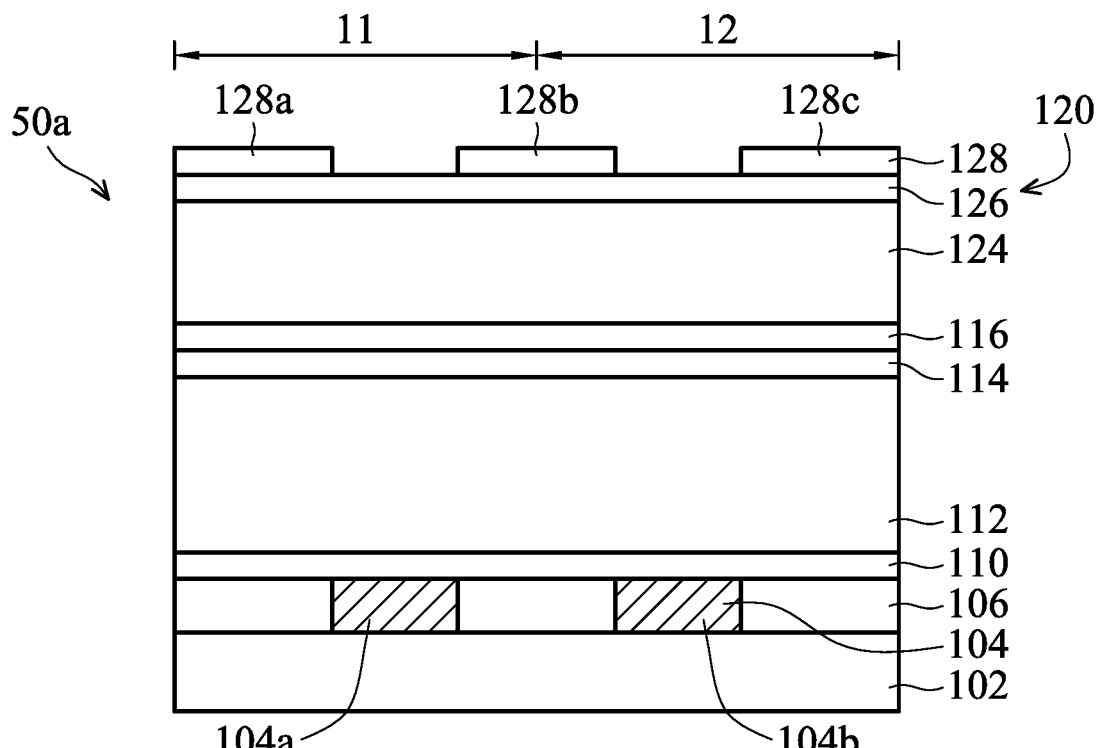
Figure 2C:
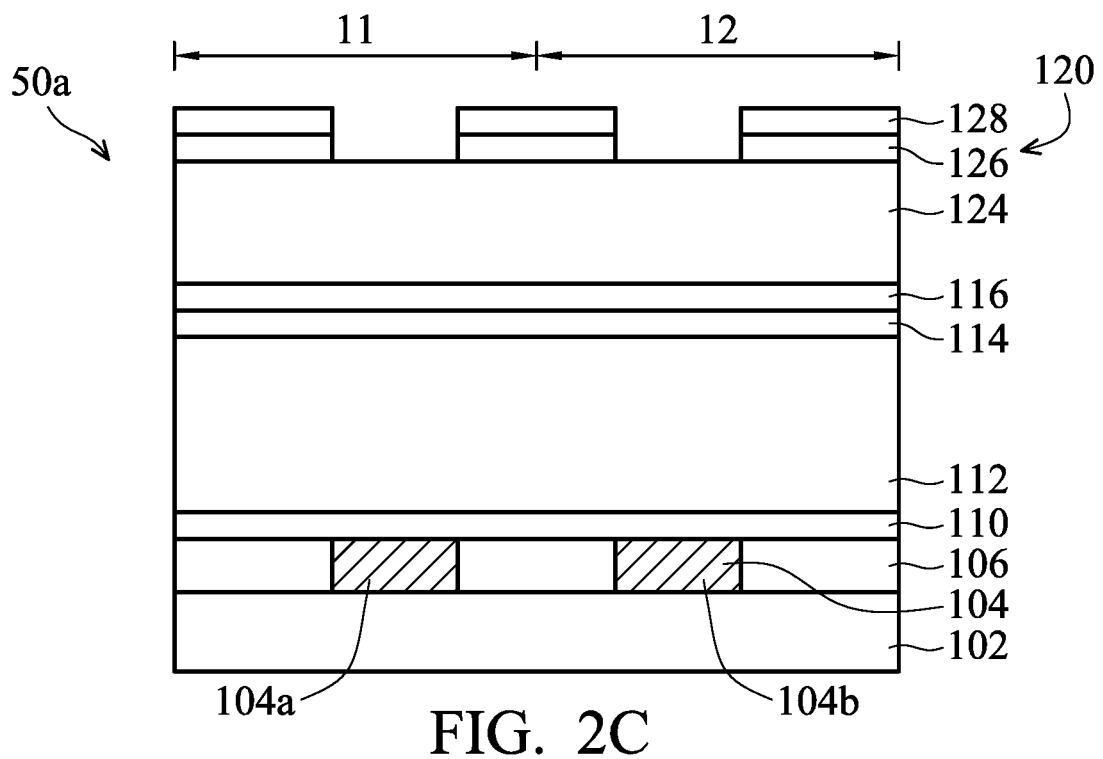
Figure 2D:
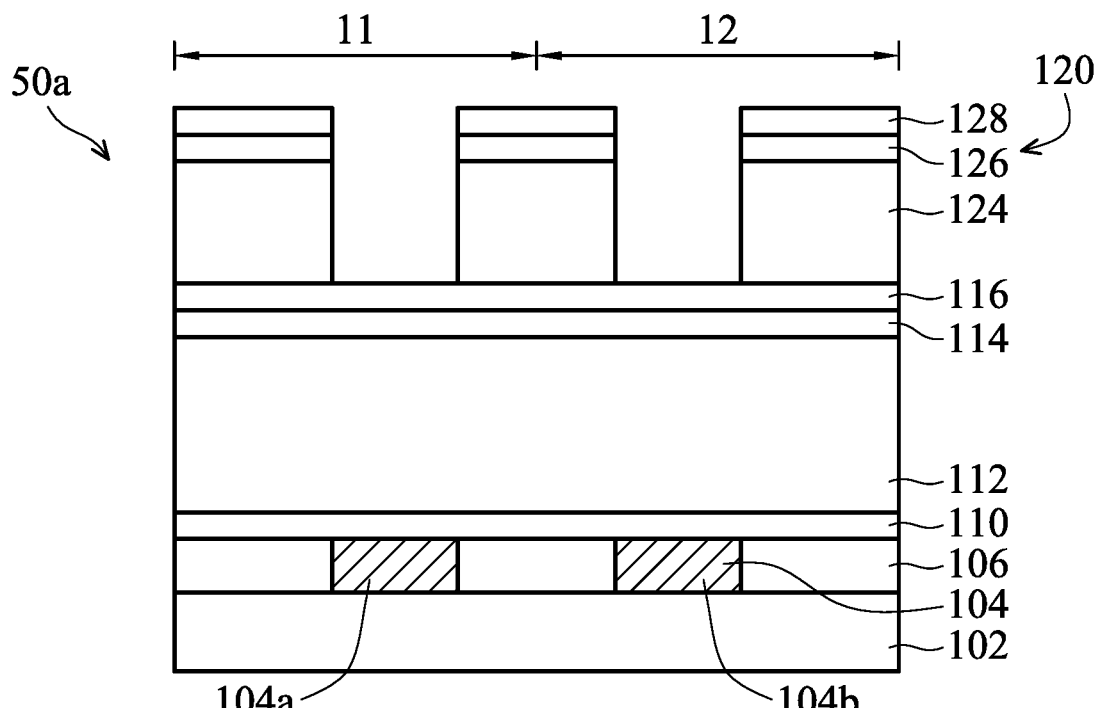
Figure 2E:
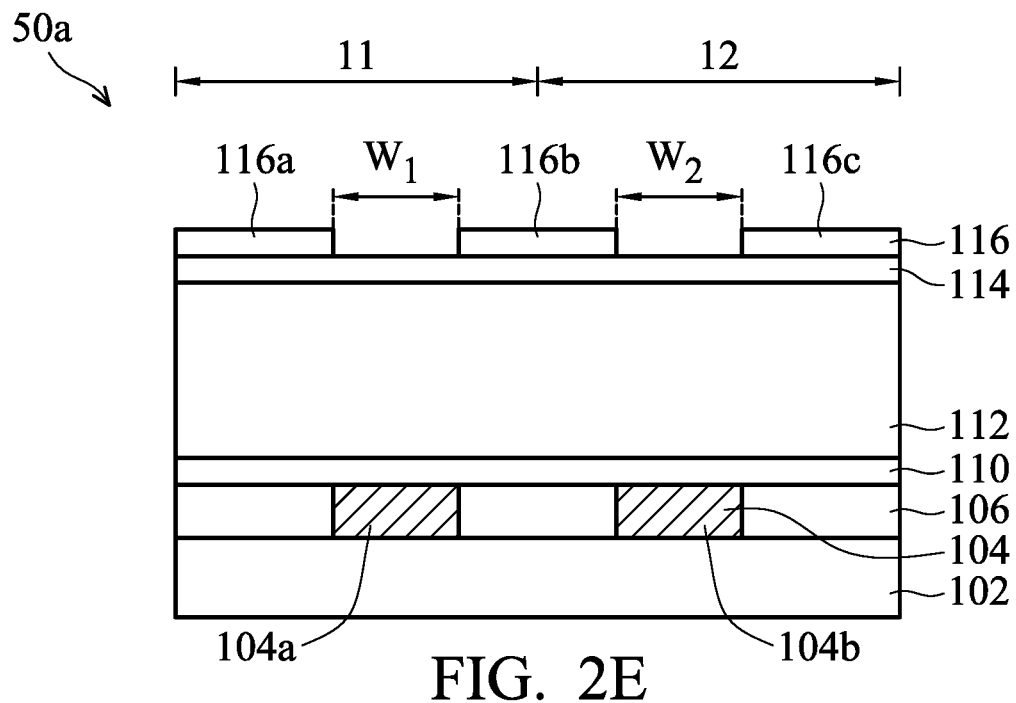
Figure 2F:
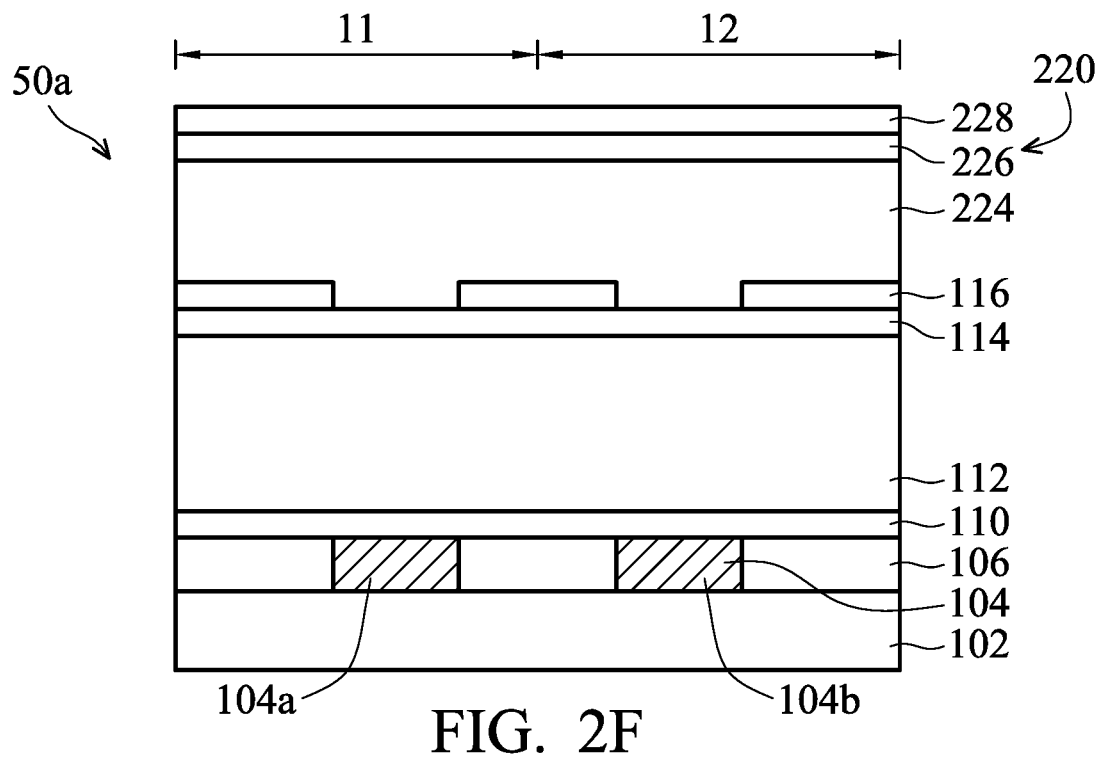
Figure 2G:
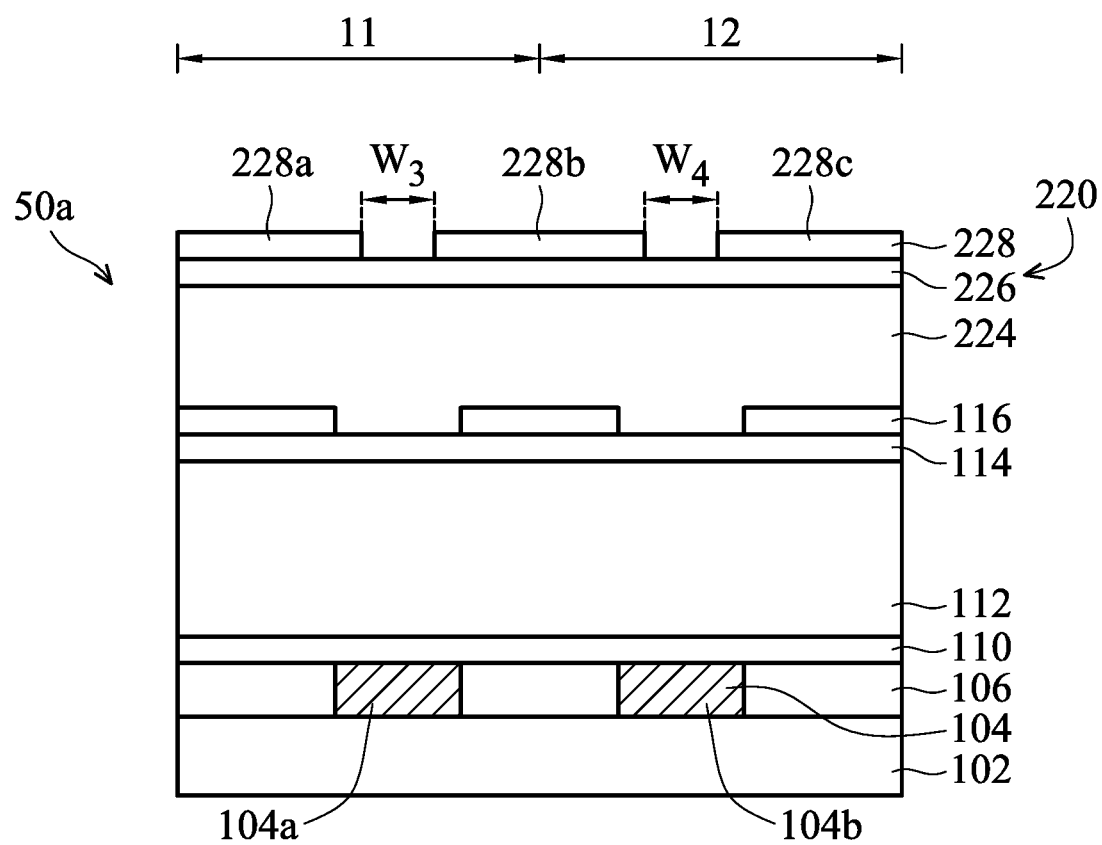
Figure 2H:
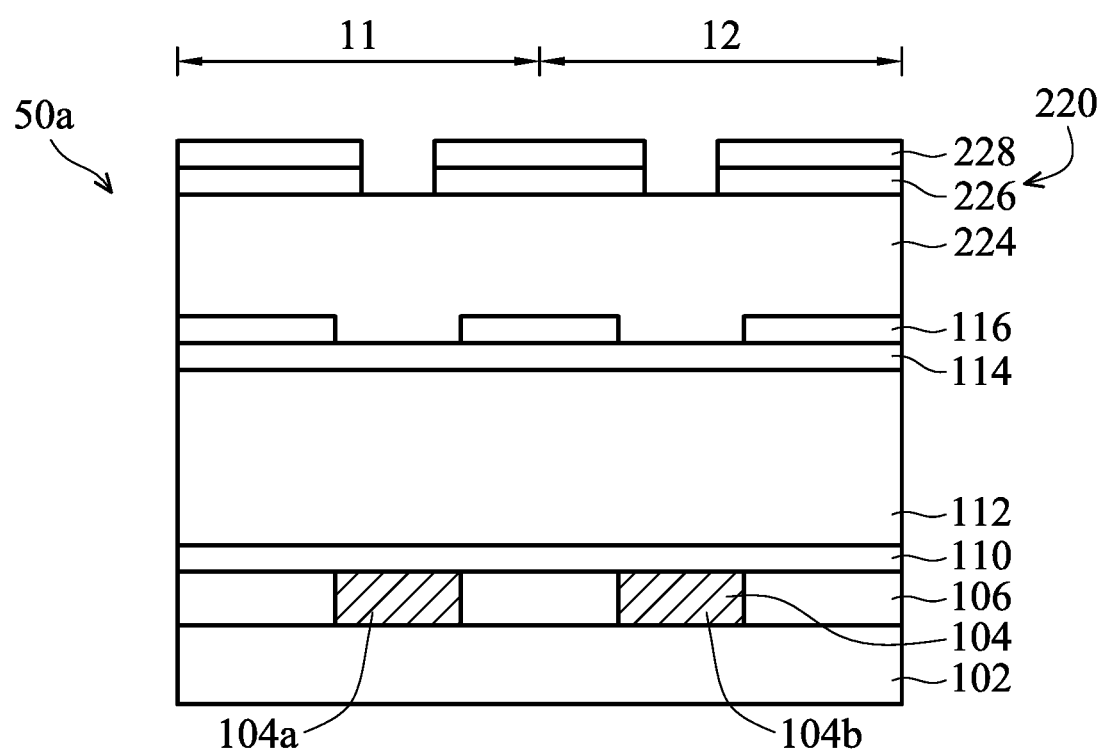
Figure 2I:
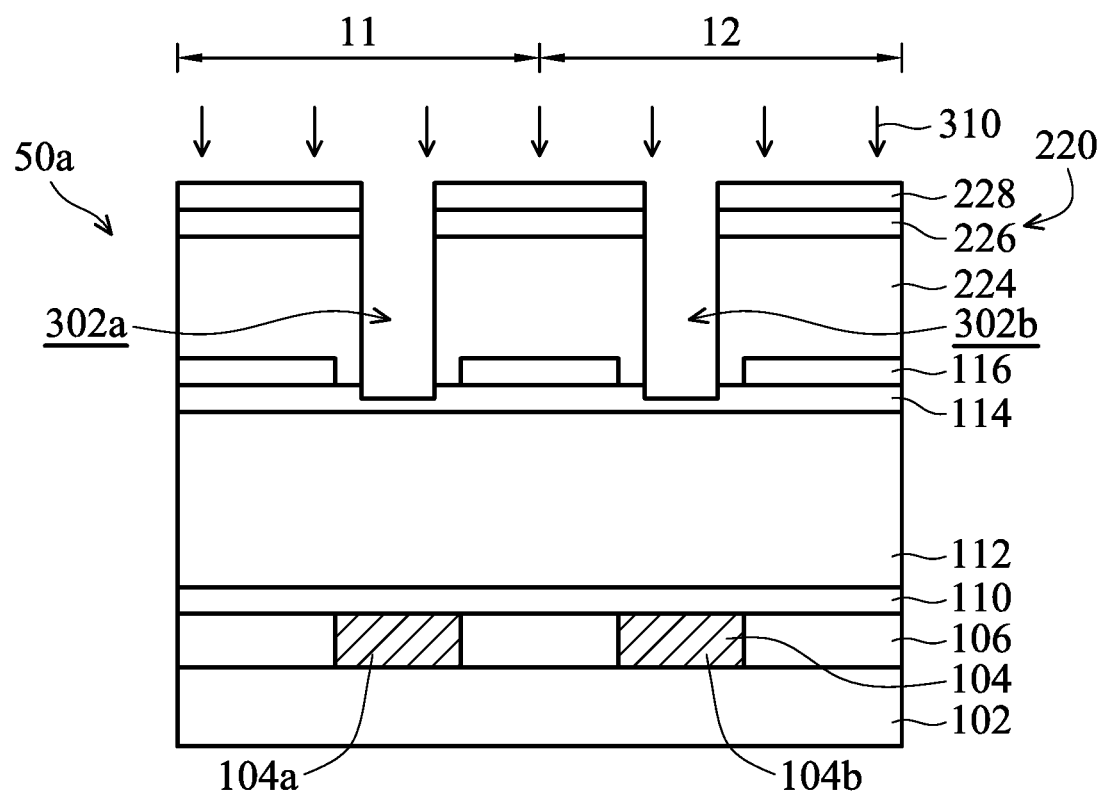
Figure 2J:
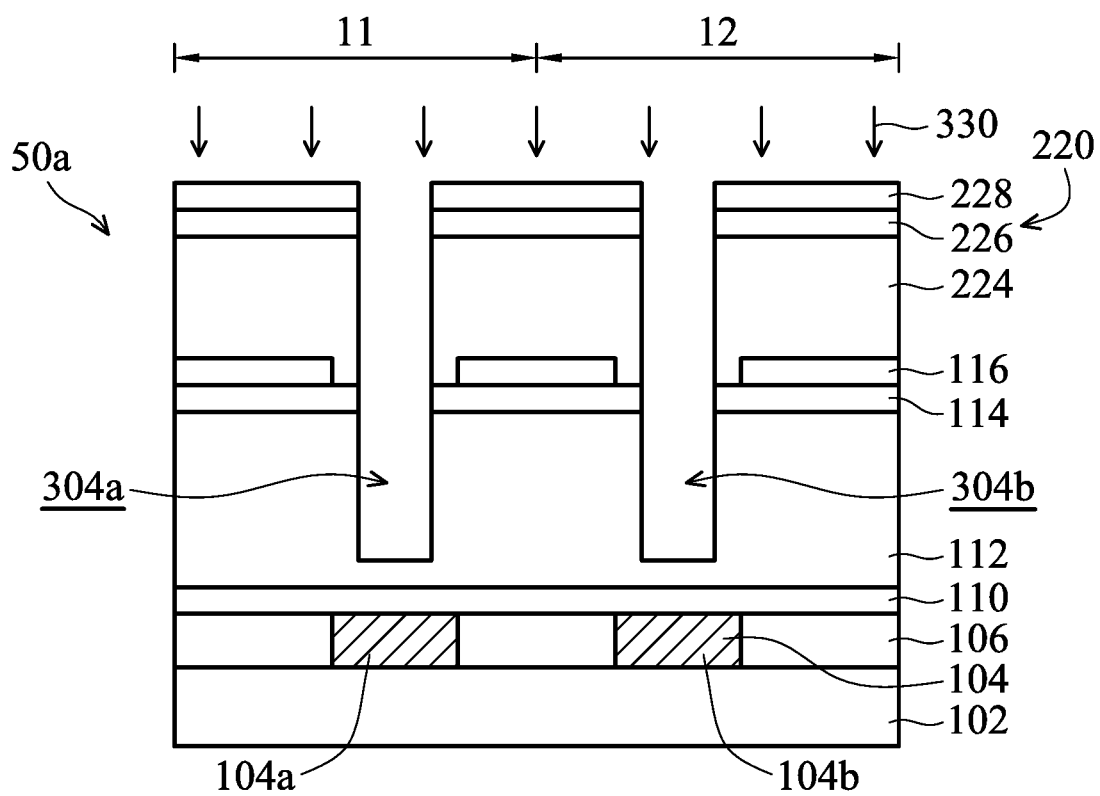
Figure 2K:
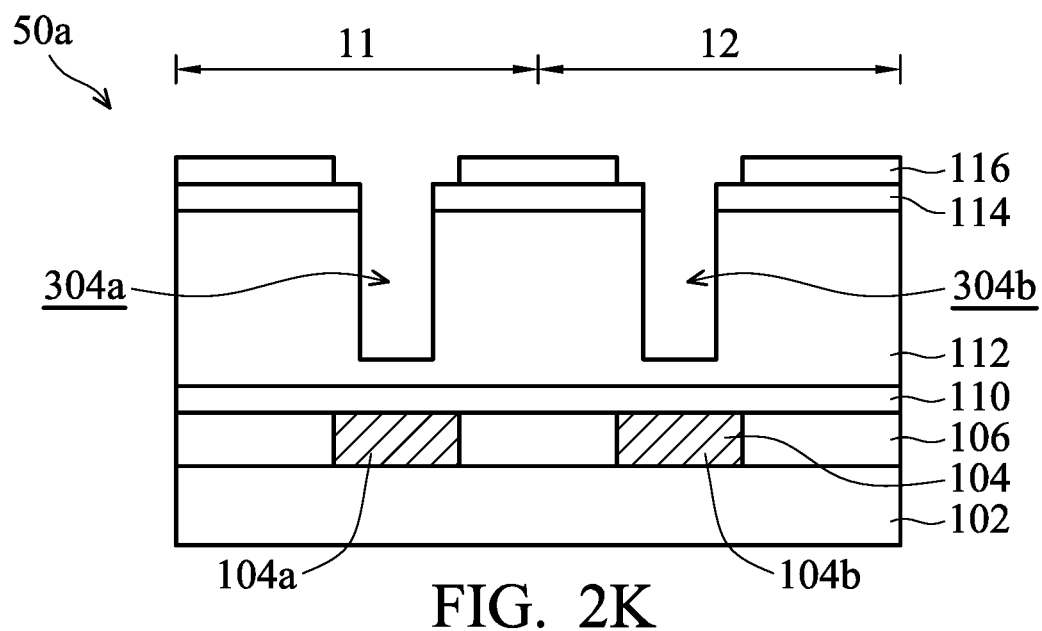
Figure 2L:
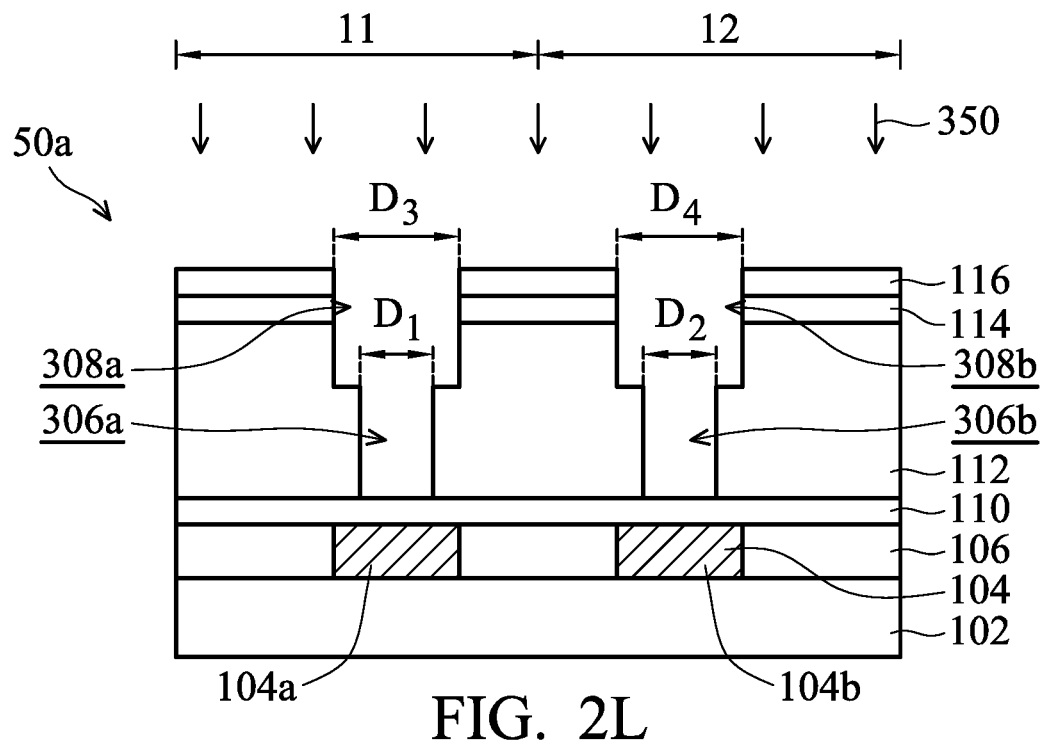
Figure 2M:
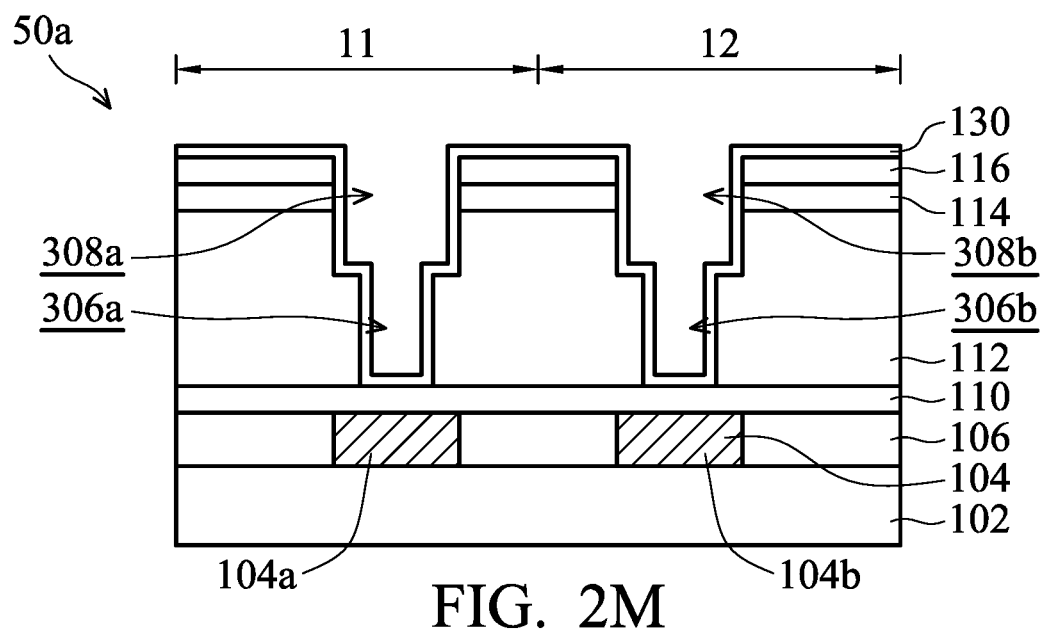
Figure 2N:
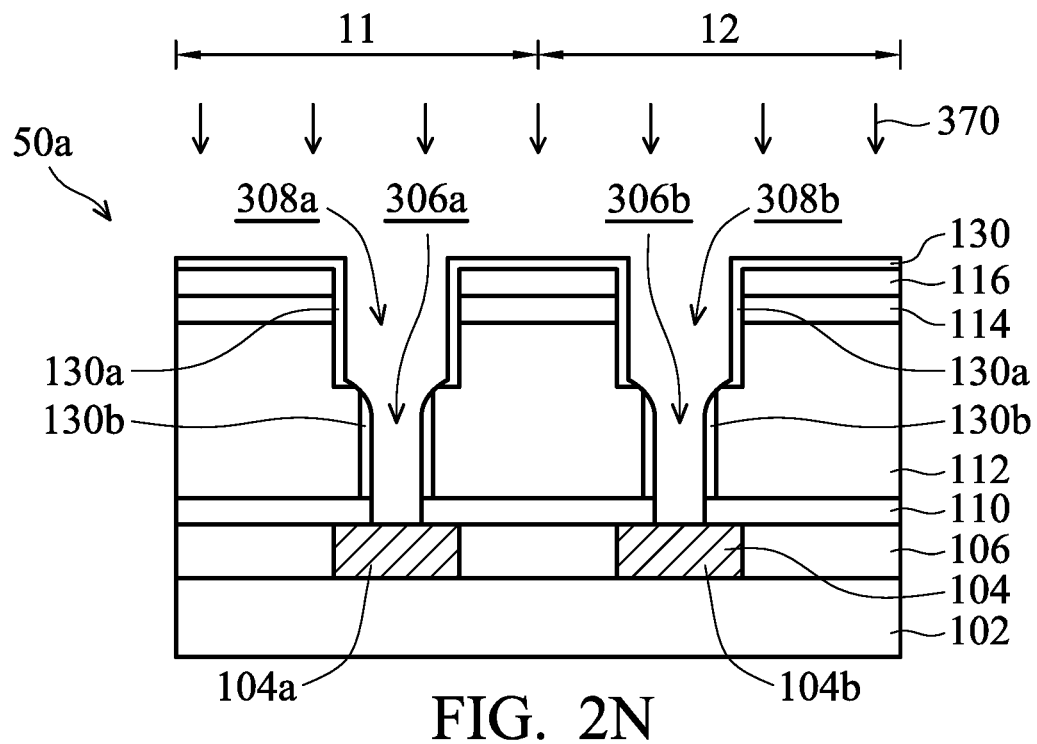
Figure 2O:
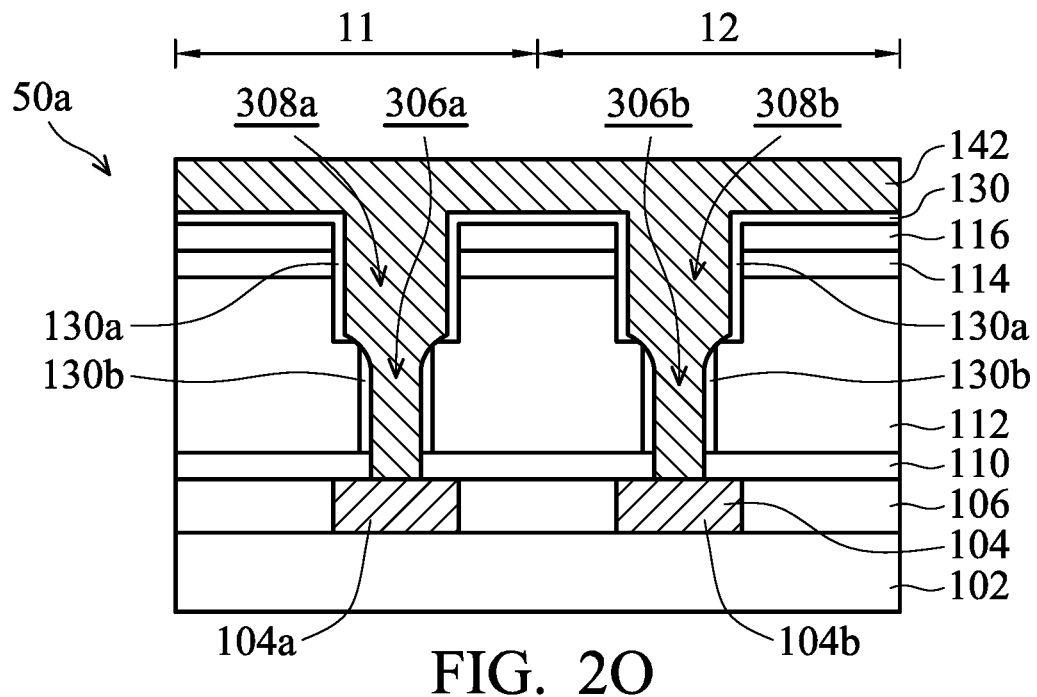
Figure 2P:
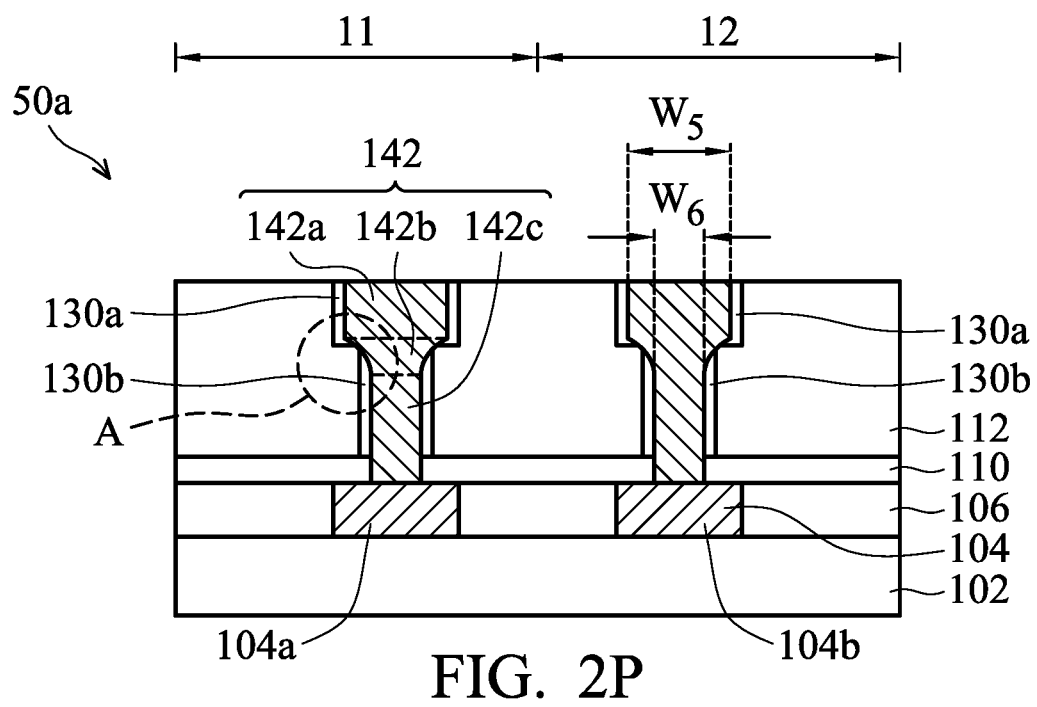
Figure 2P:
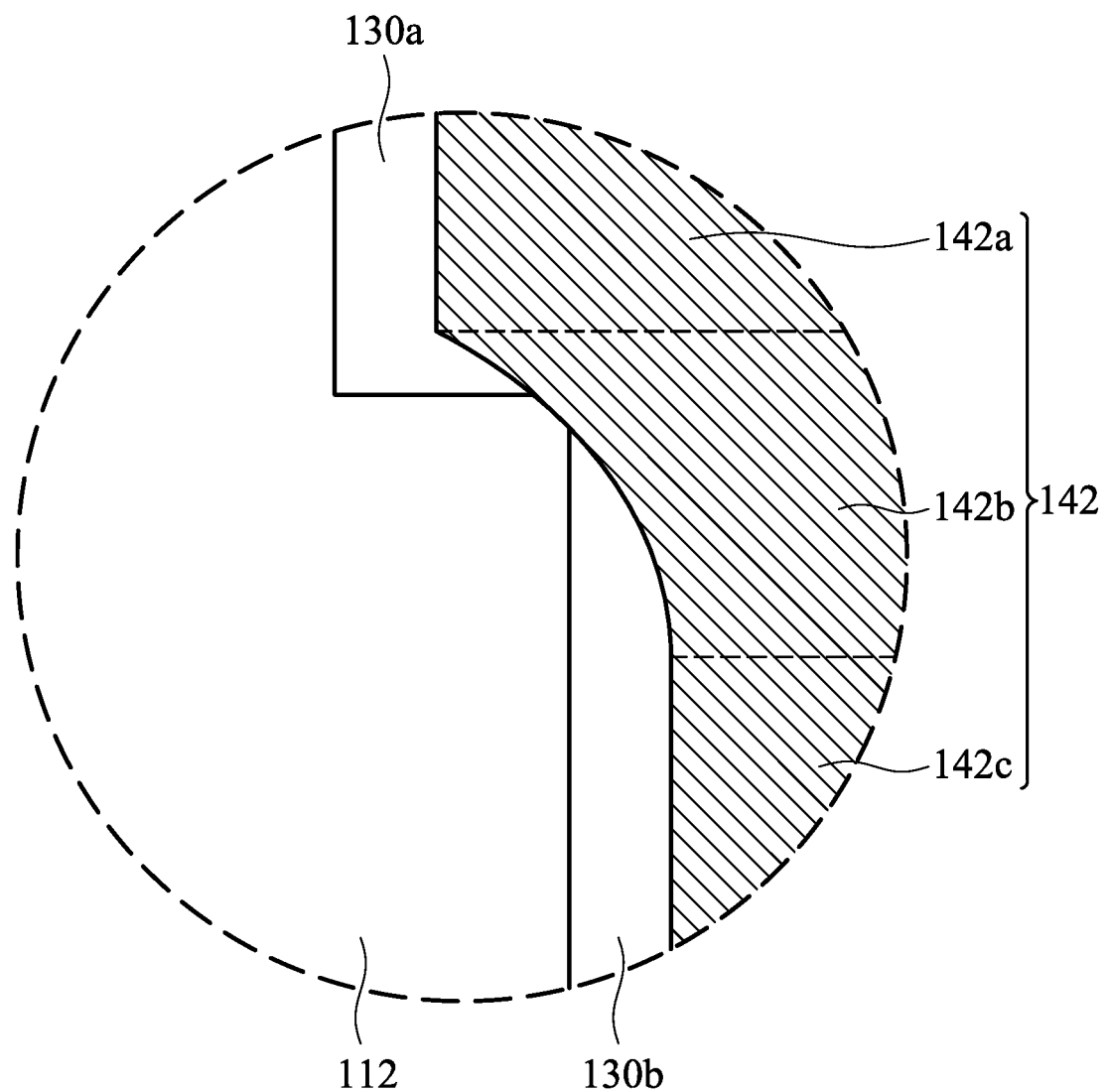

FIGS. 2A-2P show cross-sectional representations of various stages of forming a semiconductor device structure with an interconnect structure 50a, in accordance with some embodiments of the disclosure. FIGS. 2A-2P show a trench-first process for forming a dual damascene structure.

As shown in FIG. 2A, the semiconductor device structure 100 includes a substrate 102. The substrate 102 includes a first region 11 and a second region 12. IN some embodiments, the first region 11 is a dense region, and the second region 12 is an isolation region. The substrate 102 may be made of silicon or other semiconductor materials. Some device elements (not shown) are formed in the substrate 102. Device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 102 in a front-end-of-line (FEOL) process.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

As shown in FIG. 2A, a first dielectric layer 106 (such as inter-metal dielectric, IMD) is formed on the substrate 102, and a first metal layer 104a and a second metal layer 104b are embedded in first dielectric layer 106. The first metal layer 104a is in the first region 11 and the second metal layer 104b is in the second region 12. The first dielectric layer 106 and first metal layer 104a, second metal layer 104b are formed in a back-end-of-line (BEOL) process.

The first dielectric layer 106 may be a single layer or multiple layers. The first dielectric layer 106 is made of silicon oxide (SiOx), silicon nitride (SixNy), silicon oxynitride (SiON), dielectric material(s) with low dielectric constant (low-k), or combinations thereof. In some embodiments, the first dielectric layer 106 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 106 is deposited by a plasma enhanced chemical vapor deposition (PECVD) process or by a spin coating process.

In some embodiments, the first metal layer 104a and the second metal layer 104b are independently made of copper (Cu), copper alloy, aluminum (Al), aluminum alloy, tungsten (W), tungsten alloy, titanium (Ti), titanium alloy, tantalum (Ta) or tantalum alloy. In some embodiments, the first metal layer 104 is formed by a plating method.

An etch stop layer 110 is formed over the first dielectric layer 106. The etch stop layer 110 may be a single layer or multiple layers. The etch stop layer 110 protects the underlying layers, such as the first dielectric layer 106 and also provides improved adhesion for layers formed subsequently.

The etch stop layer 110 is made of a metal-containing material, such as an aluminum-containing material. In some embodiments, the aluminum-containing material is aluminum nitride, aluminum oxide or aluminum oxynitride. The aluminum-containing material may increase the speed of the semiconductor device 100.

A second dielectric layer 112 is formed over the etch stop layer 110. The second dielectric layer 112 may be a single layer or multiple layers. The second dielectric layer 112 is made of silicon oxide (SiOx), silicon nitride (SixNy), silicon oxynitride (SiON), dielectric material(s) with low dielectric constant (low-k), or combinations thereof. In some embodiments, the second dielectric layer 112 is made of an extreme low-k (ELK) dielectric material with a dielectric constant (k) less than about 2.5.

An antireflection layer 114 and a hard mask layer 116 are sequentially formed over the second dielectric layer 112. In some embodiments, the antireflection layer 114 is made of nitrogen-free material, such as silicon oxycarbide (SiOC). In some embodiments, the hard mask layer 116 is made of a metal material, such as titanium nitride (TiN), tantalum nitride (TaN), or tungsten nitride (WN). The hard mask layer 116 made of metal material is configured to provide a high etch selectivity relative to the second dielectric layer 112 during the plasma process.

A tri-layer photoresist structure 120 is formed on the hard mask layer 116. The tri-layer photoresist structure 120 includes a bottom layer 124, a middle layer 126 and a top layer 128. In some embodiments, the bottom layer 124 is a bottom anti-reflective coating (BARC) layer which is used to reduce reflection during the photolithography process. In some embodiments, the bottom layer 124 is made of nitrogen-free material, such as silicon rich oxide, or silicon oxycarbide (SiOC). In some embodiments, the middle layer 126 is made of silicon-based material, such as silicon nitride, silicon oxynitride or silicon oxide.

The top layer 128 may be a positive photoresist layer or a negative photoresist layer. In some embodiments, the top layer 128 is made of Poly (methyl methacrylate) (PMMA), Poly (methyl glutarimide) (PMGI), Phenol formaldehyde resin (DNQ/Novolac) or SU-8. In some embodiments, the ratio of the thickness of the bottom layer 124 to the thickness of the middle layer 126 is in a range from about 4 to about 8.

Afterwards, the top layer 128 is patterned to form a patterned top layer 128 as shown in FIG. 2B, in accordance with some embodiments of the disclosure. The patterned top layer 128 includes a first portion 128a, a second portion 128b and a third portion 128c.

After the top layer 128 is patterned, the middle layer 126 is patterned by using the patterned top layer 128 as a mask as shown in FIG. 2C, in accordance with some embodiments of the disclosure. As a result, the pattern of the top layer 128 is transferred to the middle layer 126 to form the patterned middle layer 126.

After the middle layer 126 is patterned, the bottom layer 124 is patterned by using the patterned middle layer 126 as a mask as shown in FIG. 2D, in accordance with some embodiments of the disclosure.

Afterwards, the hard mask layer 116 is patterned by using the patterned bottom layer 124 as a mask as shown in FIG. 2E, in accordance with some embodiments of the disclosure. Afterwards, the tri-layer photoresist structure 120 is removed by an etching process. Therefore, the patterned hard mask layer 116 is obtained, and it includes a first portion 116a, a second portion 116b and a third portion 116c. The first width $W_1$ is formed between the first portion 116a and the second portion 116b. The second width $W_2$ is formed between the second portion 116b and the third portion 116c. In some embodiments, the first width $W_1$ is substantially equal to the second width $W_2$.

After the hard mask layer 116 is patterned, a second photoresist structure 220 is formed over the patterned hard mask layer 116 as shown in FIG. 2F, in accordance with some embodiments of the disclosure. The second photoresist structure 220 includes a bottom layer 224, a middle layer 226 and a top layer 228.

The top layer 228 of the second photoresist structure 220 is firstly patterned to form a patterned top layer 228 as shown in FIG. 2G, in accordance with some embodiments of the disclosure. The patterned top layer 228 includes a first portion 228a, a second portion 228b and a third portion 228c. A third width $W_3$ is formed between the first portion 228a and the second portion 228b. A fourth width $W_4$ is formed between the second portion 228b and the third portion 228c. The third width $W_3$ is substantially equal to the fourth width $W_4$. The third width $W_3$ between the first portion 228a and the second portion 228b is smaller than the first width $W_1$ (as shown in FIG. 2E) between the first portion 116a and the second portion 116b of the patterned hard mask layer 116.

Afterwards, the middle layer 226 is patterned by using the patterned top layer 228 as a mask as shown in FIG. 2H, in accordance with some embodiments of the disclosure.

After the middle layer 226 is pattered, the bottom layer 224 and a portion of antireflection layer 114 is removed as shown in FIG. 2I, in accordance with some embodiments of the disclosure. The portion of antireflection layer 114 is removed by a first etching process 310 to form a first recess 302a in the first region 11 and a second recess 302b in the second region 12. The sidewalls of the recess 302 are vertical to the antireflection layer 114. The width of the first recess 302a is substantially equal to the width of the second recess 302b.

The first plasma process 310 includes using a first etch gas including oxygen gas ($O_2$), carbon dioxide ($CO_2$) or another applicable gas. In addition to gas, the first etching process 310 may be fine-tuned with various parameters, such as pressure, power, temperature and/or other suitable parameters.

After forming the first recess 302a and the second recess 302b, the antireflection layer 114 is etched through and a portion of the second dielectric layer 112 is removed by a second etching process 330 as shown in FIG. 2J, in accordance with some embodiments of the disclosure.

As a result, the recess 302 is elongated to form a first opening 304a and a second opening 304b. It should be noted that the sidewalls of the first opening 304a and second opening 304b are vertical to the second dielectric layer 112. In other words, the first opening 304a and the second opening 304b both have a substantially vertical profile.

The second etching process 330 is performed by using a second etch gas including fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

Afterwards, the second photoresist structure 220 is removed as shown in FIG. 2K, in accordance with some embodiments of the disclosure. Therefore, the patterned hard mask layer 116 is exposed.

After the second photoresist structure 220 is removed, the second dielectric layer 112 and the etch stop layer 110 are etched through to expose the first metal layer 104 by a third etching process 350 as shown in FIG. 2L, in accordance with some embodiments of the disclosure.

Therefore, a first via opening 306a and a first trench opening 308a are formed and they collectively constitute a first trench-via structure for use as a dual damascene cavity. The first via opening 306a has a first width $D_1$. In some embodiments, the first width $D_1$ is in a range from about 30 nm to about 60 nm. The first trench opening 308a has a third width $D_3$. In some embodiments, the third width $D_3$ is greater than the first width $D_1$.

If the first width $D_1$ is smaller than 30 nm, the dimensions are too small to fill the conductive material. If the first width $D_1$ is greater than 60 nm, the pitch between two adjacent via openings may be smaller than the predetermined value.

The third etching process 350 is performed by using a third etch gas including fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

The third etch gas used in the third etching process 350 further includes a diluting gas, such as an inert gas, for example argon (Ar) or helium (He). The diluting gas is used to decrease the loading effect.

After the third etching process 350, an adhesion layer 130 is formed on sidewalls and the bottom surfaces of the via openings 306a, 306b and trench openings 308a, 308b as shown in FIG. 2M, in accordance with some embodiments of the disclosure. In addition, the adhesion layer 130 is also formed on the hard mask layer 116.

The adhesion layer 130 is used to provide improved adhesion for layers formed subsequently. In some embodiments, the adhesion layer 130 is made of titanium (Ti), titanium nitride (TiN), tantalum (Ta), tantalum nitride (TaN), or aluminum nitride (AlN).

After formation of the adhesion layer 130, a portion of the etch stop layer 110 is removed to expose the first metal layer 104a and the second metal layer 104b by a fourth etching process 370, as shown in FIG. 2N, in accordance with some embodiments of the disclosure.

In some embodiments, the fourth etching process 370 is a dry etching process, such as plasma process. During the fourth etching process 370, the electric field concentrates at corners region of the opening. Therefore, corner region may be damaged. As shown in FIG. 2N, a portion of the adhesion layer 130 is also removed, especially at corner regions. As a result, the adhesion layer 130 becomes a discontinuous layer.

The adhesion layer 130 includes a first portion 130a and a second portion 130b below the first portion 130a. The first portion 130a is adjacent to or lines with the trench openings 308a, 308b, and the second portion 130b is adjacent to or lines with the via openings 306a, 306b.

In some embodiments, the first portion 130a of the adhesion layer 130 has an extended bottom surface in a horizontal direction (in parallel to the top surface of the metal layer 104). The extended bottom surface is larger than a top surface of the first portion 130a of the adhesion layer 130.

In some embodiments, the second portion 130b of the adhesion layer 130 has a sloped surface. In some embodiments, the second portion 130b of the adhesion layer 130 has a top surface which is not parallel to a top surface of the first metal layer 104a, 104b.

After the fourth etching process 370, a conductive feature 142 is formed in the trench openings 308a, 308b, the via opening 306a, 306b and on the hard mask layer 116, as shown in FIG. 2O, in accordance with some embodiments of the disclosure.

The conductive feature 142 is electrically connected to the first metal layer 104. In some embodiments, the conductive feature 142 is referred to a second metal layer. The first metal layer 104 embedded in the first dielectric layer 106 and the conductive feature 142 embedded in second dielectric layer 112 construct a portion of the interconnect structure 50a. In some embodiments, the conductive feature 142 is made of copper (Cu), copper alloy, aluminum (Al), aluminum alloys, or combinations thereof.

It should be noted that the adhesion between the dielectric layer 112 (especially low-k material) and the conductive feature 142 is poor. If no adhesion layer 130 formed between the dielectric layer 112 and the conductive feature 142, the conductive feature 142 may be shrunk by a baking process which is performed after FIG. 2P. Therefore, the adhesion layer 130 is configured to increase the adhesion and prevent the shrinkage problem of the conductive feature 142.

Afterwards, the antireflection layer 114, the hard mask layer 116 and some conductive feature 142 out of the trench openings 308a, 308b are removed, as shown in FIG. 2P, in accordance with some embodiments of the disclosure. FIG. 2P' shows an enlarged representation of region A of FIG. 2P, in accordance with some embodiments of the disclosure. In some embodiments, the antireflection layer 114 and hard mask layer 116 are removed by a chemical mechanical polishing (CMP) process.

As shown in FIG. 2P, a portion of the conductive feature 142 is surrounded by the adhesion layer 130, but not all of the conductive feature 142 is surrounded by the adhesion layer 130. The conductive feature 142 includes an upper portion (or called as trench portion) 142a, a lower portion 142c (or called as via portion), and a middle portion (or called as interface portion) 142b between the upper portion 142a and the lower portion 142c. No obvious interfaces exist between the upper portion 142a and the middle portion 142b, and between the middle portion 142b (or interface portion) and the lower portion 142c. The dashed lines shown in FIG. 2P are used to clarify the disclosure.

The upper portion 142a has a constant width $W_5$, and the lower portion 142c has a constant width $W_6$. However, the middle portion 142b has a tapered width which is gradually tapered from the upper portion 142a to the lower portion 142c. In other words, the middle portion 142b has a pair of curved sidewalls. The width $W_5$ is larger than the width $W_6$, and the tapered width is smaller than the width $W_5$ and larger than the width $W_6$.

It should be noted that the adhesion layer 130 is formed between the conductive feature 142 and the second dielectric layer 112, and portions of upper portion 142a and the lower portion 142c of the conductive feature 142 are not formed on the adhesion layer 130. But, a portion of the middle portion 142b of the conductive feature 142 is not formed on the adhesion layer 130. Instead of contacting with the adhesion layer 130, the middle portion 142b of the conductive feature 142 is directly contact with the second dielectric layer 112 because the adhesion layer 130 is a discontinuous layer.

As mentioned above, the adhesion layer 130 includes the first portion 130a and the second portion 130b. As shown in FIGS. 2P and 2P', the first portion 130a lines with the upper portion 142a of the conductive feature 142, and the second portion 130b lines with the lower portion 142c of the conductive feature 142. A portion of the interconnect structure is surrounded by the etch stop layer. More specifically, a portion of the conductive feature 142 is surrounded by the etch stop layer 110.

While performing the fourth etching process 370 (as shown in FIG. 2N), the first metal layers 104a, 104b are exposed and some by-products (such as metal-containing material) may form on the via openings 306a, 306b. However, if the undesirable by-products are deposited on the sidewalls of the via openings 306a, 306b, the widths of the via openings 306a, 306b may become smaller, and the conductive feature 142 are difficult to fill into the via openings 306a, 306b. In addition, some metal-containing material may re-sputter on the sidewalls of the via openings 306a, 306b. As a result, the adhesion between the conductive feature 142 and the second dielectric layer is decreased. The conductive feature 142 may be easily delaminated while performing a baking process after the removing process shown in FIG. 2P. Therefore, the adhesion layer 130 is formed as shown in FIG. 2M before the metal layers 104a, 104b are exposed. The adhesion layer 130 protects the sidewalls of the via openings 306a, 306b from being polluted and increase the adhesion between the conductive feature 142 and the second dielectric layer 112. In addition, the delamination problem of the conductive feature 142 is also prevented.

FIGS. 3A-3E show cross-sectional representations of various stages of forming a semiconductor device structure with an interconnect structure 50b, in accordance with some embodiments of the disclosure. Interconnect structure 50b is similar to, or the same as, interconnect structure 50a as shown in FIG. 2P, except the shape of the trench openings 308a, 308b is different. Processes and materials used to form interconnect structure 50b may be similar to, or the same as, those used to form the interconnect structure 50a and are not repeated herein.

Figure 3A:
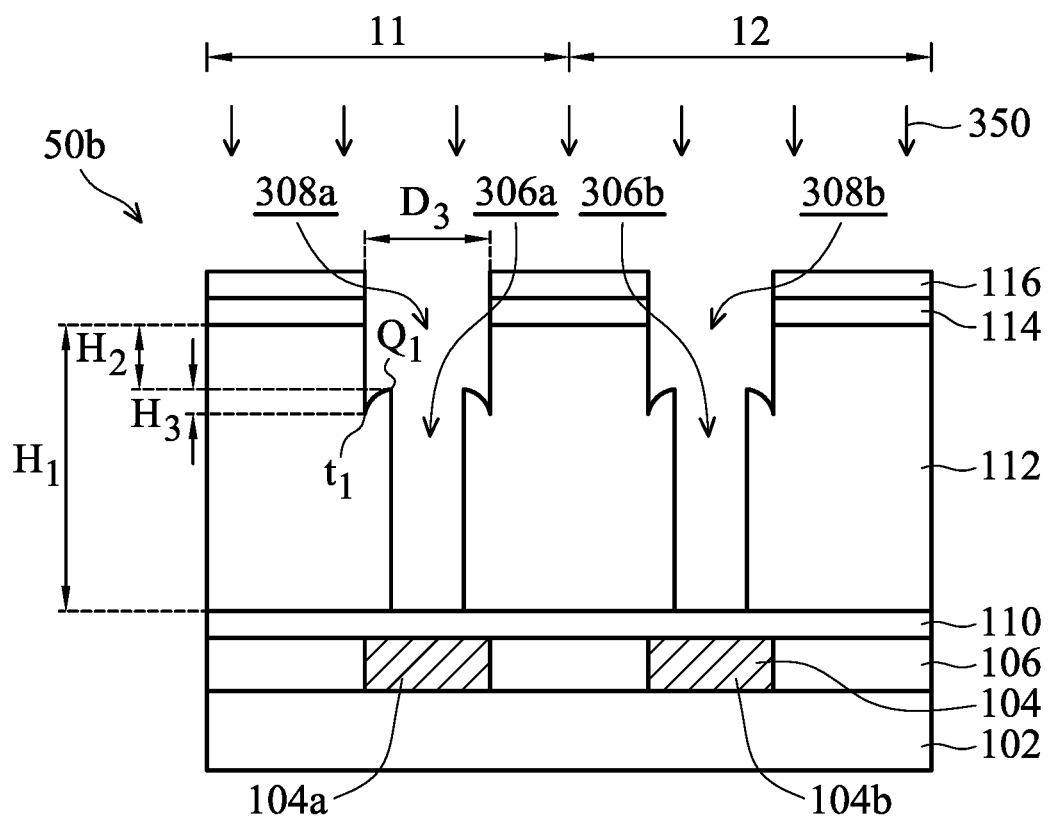
FIGS. 3A-3E show cross-sectional representations of various stages of forming a semiconductor device structure with an interconnect structure, in accordance with some embodiments of the disclosure.

As shown in FIG. 3A, the third etching process 350 is performed on the second dielectric layer 112, the first trench openings 308a and the first via openings 306a are formed in the first region 11, and the second trench openings 308b and the second via openings 306b are formed in the second region 12. The first trench openings 308a and the first via openings 306a collectively constitute a first trench-via structure for use as a dual damascene cavity. The second trench openings 308b and the second via openings 306b collectively constitute a second trench-via structure for use as a dual damascene cavity.

As shown in FIG. 3A, the trench openings 308a, 308b have extending portions. The trench opening 308a includes an upper portion with vertical sidewalls and the extending portion with curved bottom portions. An intersection between the vertical sidewall and the curved bottom portion is called as tip $P_1$. In some embodiments, the tip $P_1$ is located at a position that is a lower than a highest point $Q_1$ of the via opening 306a.

The trench-via structure has a depth $H_1$. The trench opening 308a has a width $D_3$. The aspect ratio $(H_1/D_3)$ is a ratio of the depth $H_1$ to the width $D_3$. The upper portion of the trench opening 308a has a depth $H_2$, and the extending portion has a depth $H_3$. In some embodiments, a ratio $(H_3/H_2)$ of the depth $H_3$ to the depth $H_2$ is in a range from about 0.5 to about 100.

An aspect ratio of an opening is defined as a depth to a width of the opening. It should be noted that the aspect ratio of the first trench-via structure has a higher aspect ratio, compared with the trench-via structure in FIG. 2L. If the high aspect ratio of the first trench-via structure is etched, more etching time is needed to obtain a desired profile.

Figure 5:
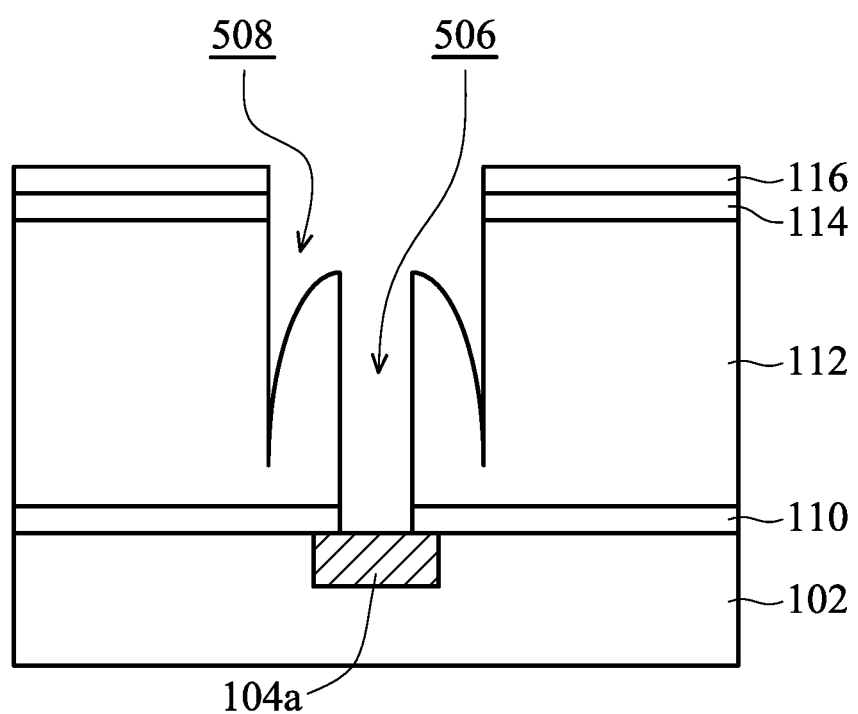
FIG. 5 shows a trench-via structure with an over-recessed trench opening.

FIG. 5 shows a trench-via structure with over-recessed trench opening 506. The trench opening 508 is formed above the via opening 506. As mentioned above, the corner regions of the trench opening will be easily attached by the third etching process 350. If the etching time is increased, the corner region of the trench opening 508 is over-recessed. As a result, the conductive formed in the via opening 506 and the trench opening 508 subsequently may contact with other regions. The over-recessed trench opening 508 is not a desired profile. In addition, if a number of the trench-via structures are located at isolated regions and the dense region, an over-etched trench structure may be produced, due to the loading effect.

Therefore, in order to prevent the trench opening from being over-etched, when the trench opening is formed, the extending portion of the trench opening should be controlled within a range by controlling the etching parameters of the third etching process 350. For example, when the ratio $(H_3/H_2)$ of the depth $H_3$ to the depth $H_2$ is controlled within a range of from about 0.5 to about 100, the third etching process 350 is stopped. The adhesion layer 130 is used to protect the sidewalls of the trench opening 308a, 308b before the trench opening 308a, 308b are over-etched.

Figure 3B:
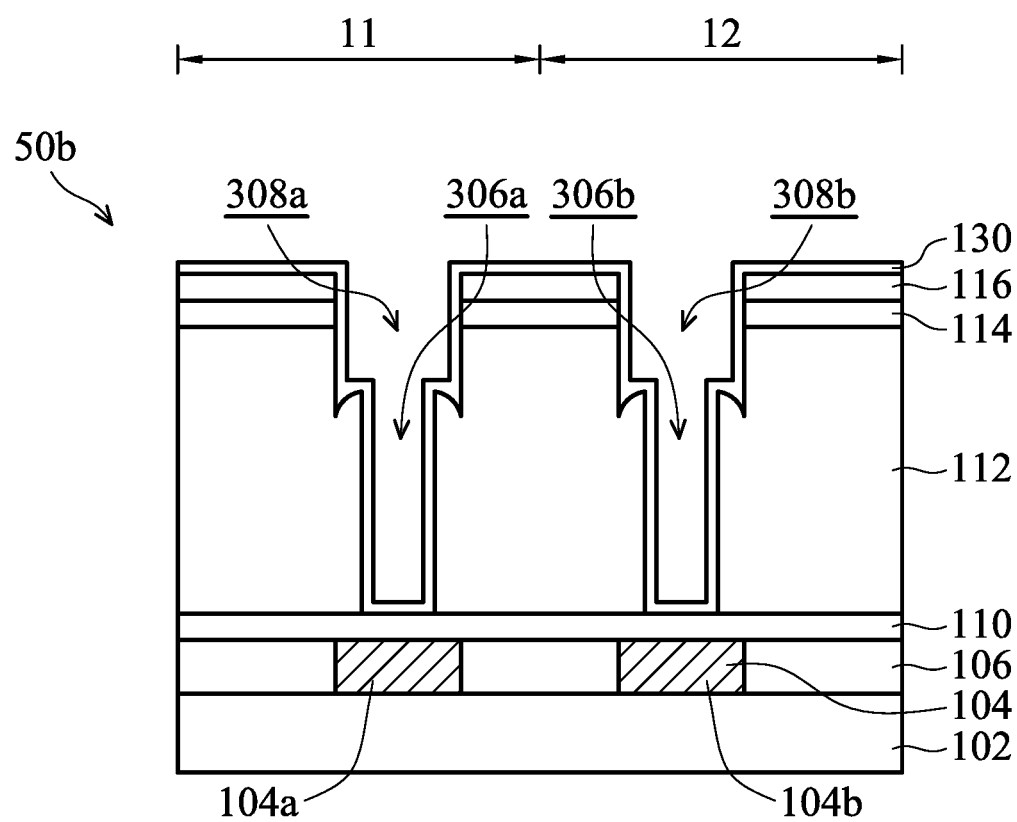

After the third etching process 350, the adhesion layer 130 is formed on sidewalls and the bottom surfaces of the via openings 306a, 306b and trench openings 308a, 308b as shown in FIG. 3B, in accordance with some embodiments of the disclosure. The adhesion layer 130 is conformally formed on the first trench-via structure with the first trench opening 308a and the first via opening 306a and the second trench-via structure with the second trench opening 308b and the second via opening 306b.

The adhesion layer 130 is used to provide improved adhesion for layers formed subsequently. In addition, since some etching process will perform on the trench-via structure, the adhesion layer 130 formed on the trench openings 308a, 308b and via openings 306a, 306b are configured to protect the trench-via structure from being over-etched.

Figure 3C:
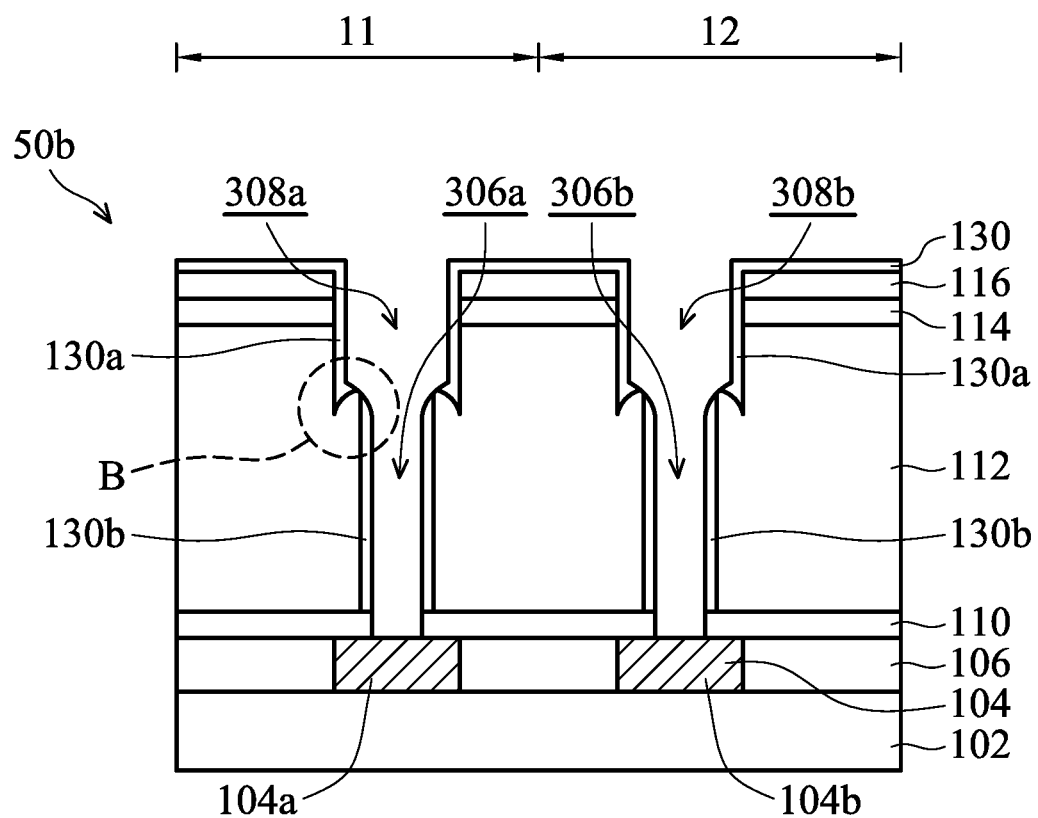
Figure 3C:
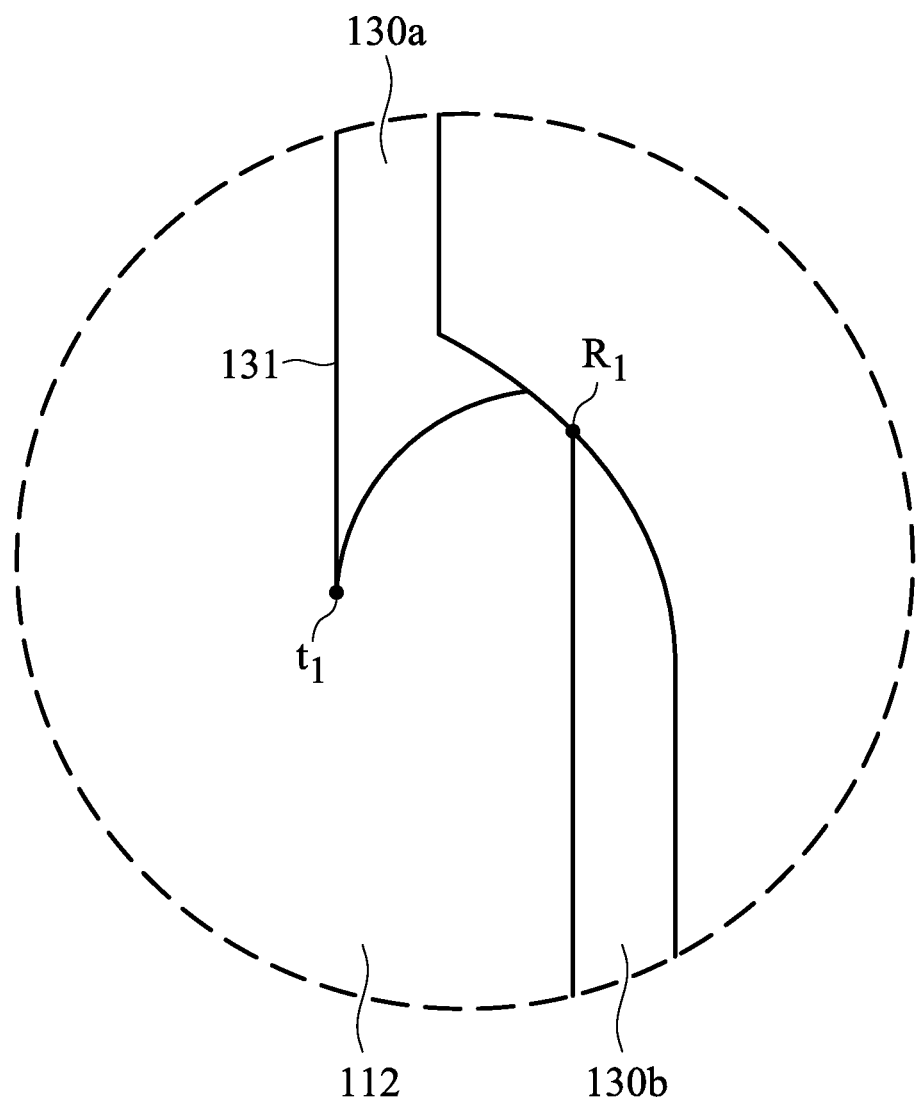

After forming the adhesion layer 130, a portion of the etch stop layer 110 is removed to expose the first metal layer 104a and the second metal layer 104b by a fourth etching process 370, as shown in FIG. 3C, in accordance with some embodiments of the disclosure.

As mentioned above, the corner regions are attached by the fourth etching process 370. As a result, the adhesion layer 130 becomes a discontinuous layer. The adhesion layer 130 includes the first portion 130a and the second portion 130b below the first portion 130a. The first portion 130a is not connected to the second portion 130b. The first portion 130a is adjacent to the trench openings 308a, 308b, and the second portion 130b is adjacent to the via opening 306a, 306b. The first portion 130a has the extending portion along a vertical direction which is vertical to a top surface of the metal layer 104a, 104b.

In some embodiments, the first portion 130a of the adhesion layer 130 has an extended bottom surface in a horizontal direction (in parallel to the top surface of the metal layer 104). The extended bottom surface is larger than a top surface of the first portion 130.

In some embodiments, the second portion 130b of the adhesion layer 130 has a sloped top surface. In some embodiments, the second portion 130b of the adhesion layer 130 has a top surface which is not parallel to a top surface of the first metal layer 104a, 104b.

When a portion of the adhesion layer 130 is removed, the trench opening 138a provide more areas to form the conductive feature 142. As a consequence, a greater volume of the conductive feature 142 is deposited on the trench-via structure compared with the embodiments without removing the portion of the adhesion layer 130, and the resistance of the interconnect structure 50b is reduced.

FIG. 3C' shows an enlarged representation of region B of FIG. 3C, in accordance with some embodiments of the disclosure. The first portion 130a of the adhesion layer 130 has a first surface 131 which is in direct contact with the second dielectric layer 112. The first surface 131 is vertical to a top surface of the first metal layers 104a, 104b. A lowest point $t_1$ is located at the first surface 131. In addition, the lowest point $t_1$ is located at a position that is higher than a highest point $R_1$ of the second portion 130*b* of the adhesion layer 130. In other words, the extending portion has a tip $t_1$ located at a position that is lower than the highest point $R_1$ of the second portion 130*b* of the adhesion layer 130.

Figure 3D:
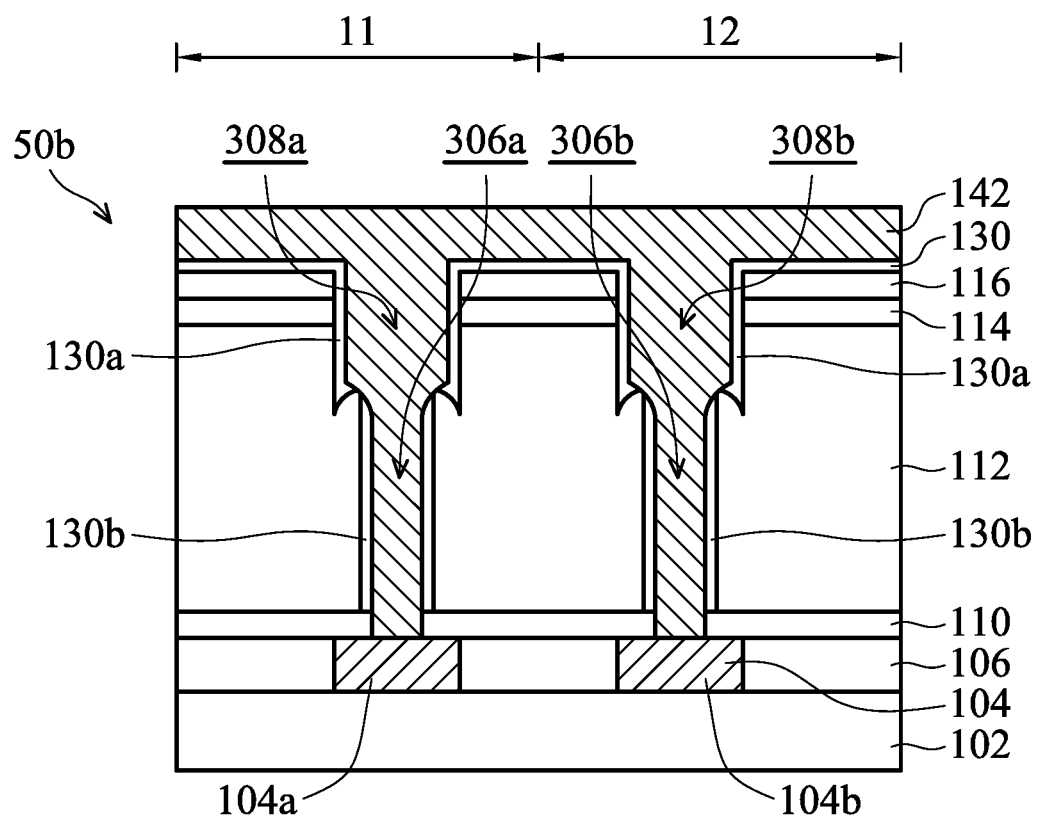

After the fourth etching process 370, the conductive feature 142 is formed in the trench openings 308*a*, 308*b*, the via openings 306*a*, 306*b* and on the hard mask layer 116, as shown in FIG. 3D, in accordance with some embodiments of the disclosure.

Figure 3E:
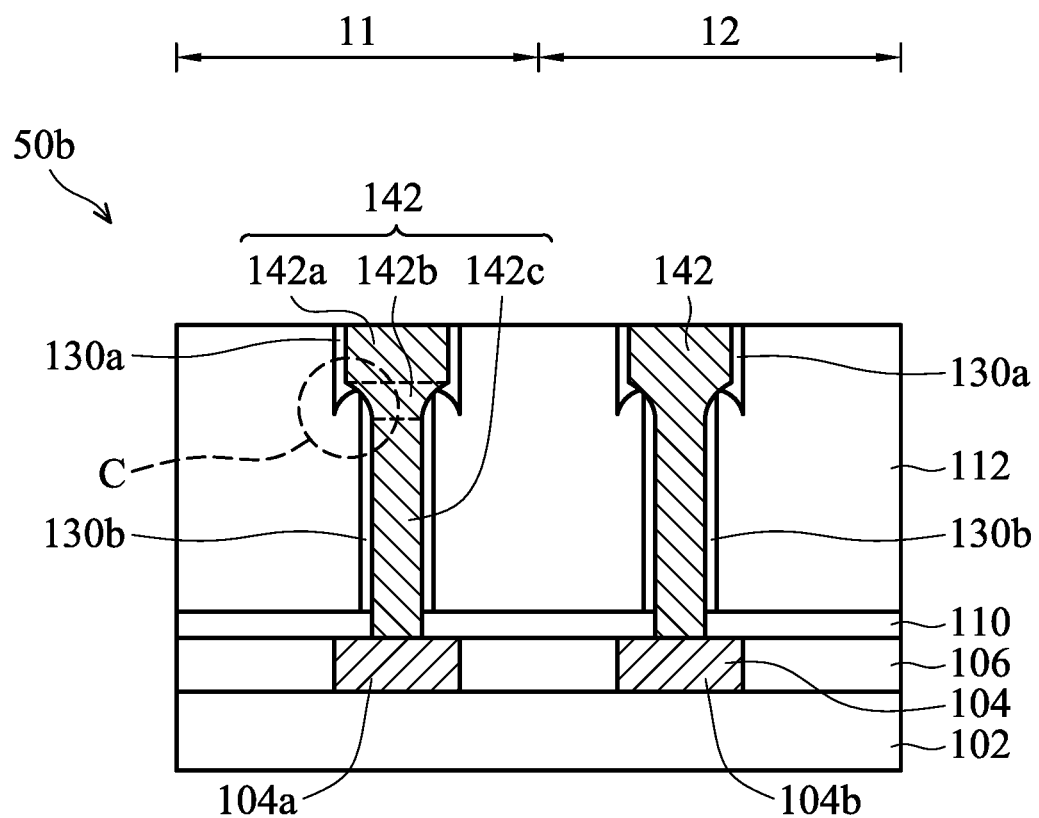
Figure 3E:
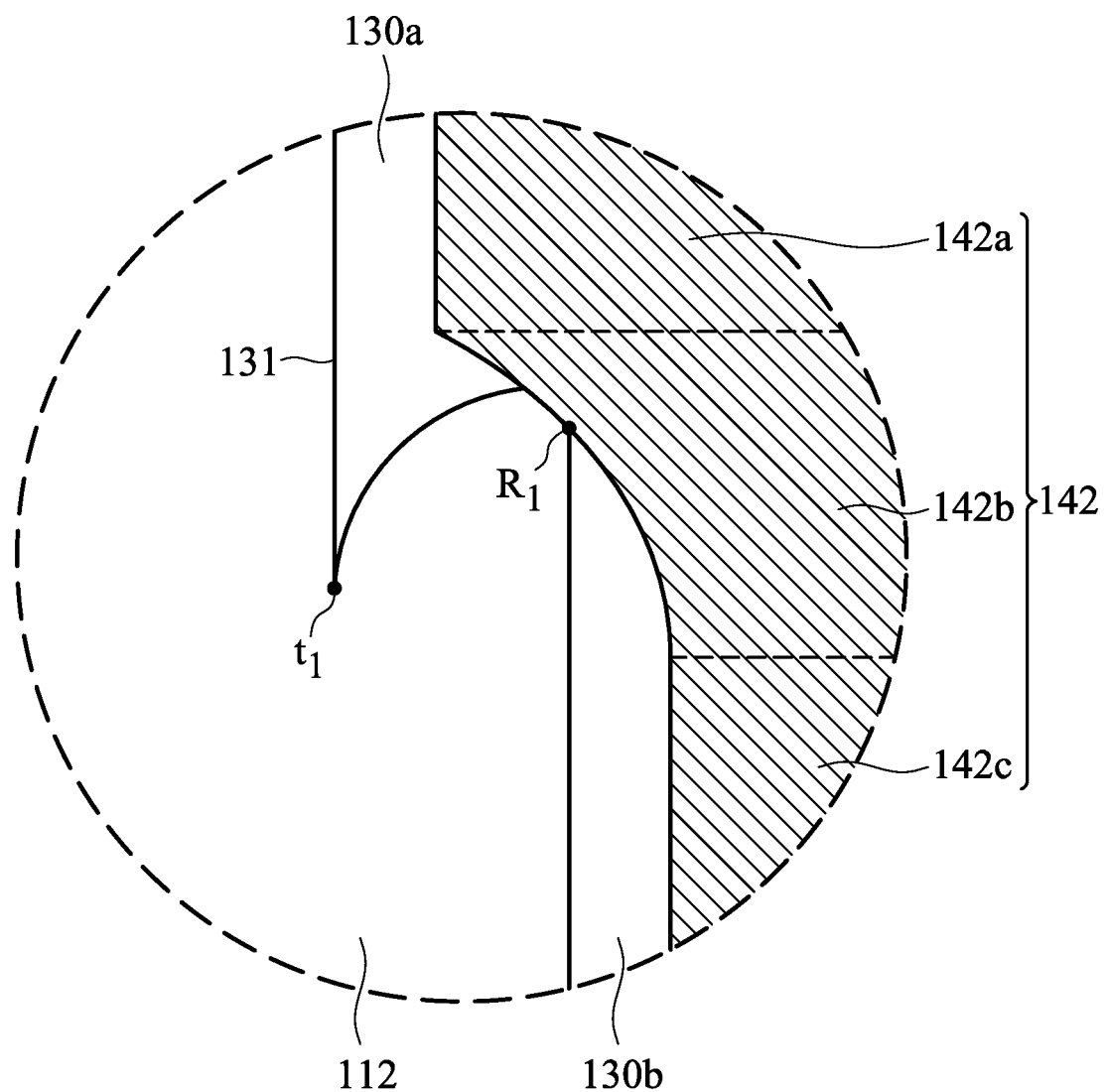

Afterwards, the antireflection layer 114, the hard mask layer 116 and some conductive feature 142 out of the trench openings 308*a*, 308*b* are removed, as shown in FIG. 3E, in accordance with some embodiments of the disclosure. In some embodiments, the antireflection layer 114 and hard mask layer 116 are removed by a chemical mechanical polishing (CMP) process.

The conductive feature 142 includes a trench portion 142*a*, interface portion 142*b* and via portion 142*c*. The interface portion 142*b* is between the trench portion 142*a* and the via portion 142*c*. The interface portion 142*b* has a pair of curved sidewalls.

FIG. 3E' shows an enlarged representation of region C of FIG. 3E, in accordance with some embodiments of the disclosure. A portion of the interface portion 142*b* is in direct contact with the second dielectric layer 112. A portion of the interface portion of the conductive feature 142 has a tapered width that is gradually tapered from the trench portion 142*a* towards to the via portion 142*c*.

FIGS. 4A-4E show cross-sectional representations of various stages of forming a semiconductor device structure with an interconnect structure 50*c*, in accordance with some embodiments of the disclosure. Interconnect structure 50*c* is similar to, or the same as, interconnect structure 50*a* as shown in FIG. 2L, except the shape of the trench openings 308*a*, 308*b* is different. Processes and materials used to form interconnect structure 50*c* may be similar to, or the same as, those used to form the interconnect structure 50*a* and are not repeated herein.

Figure 4A:
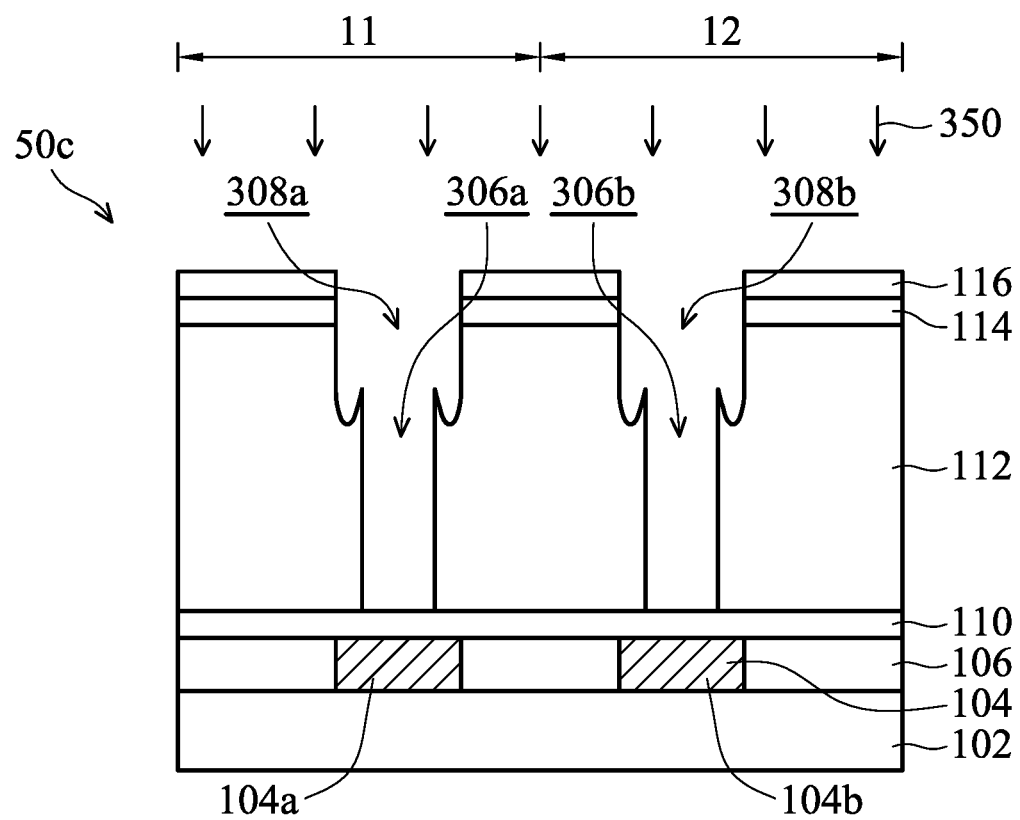
FIGS. 4A-4E show cross-sectional representations of various stages of forming a semiconductor device structure with an interconnect structure, in accordance with some embodiments of the disclosure.

As shown in FIG. 4A, the third etching process 350 is performed on the second dielectric layer 112, the trench openings 308*a* and the via openings 306*a* are formed in the first region 11, and trench openings 308*b* and the via openings 306*b* are formed in the second region 12. The bottoms of the trench openings 380*a*, 308*b* have a smooth V-shaped shape.

Figure 4B:
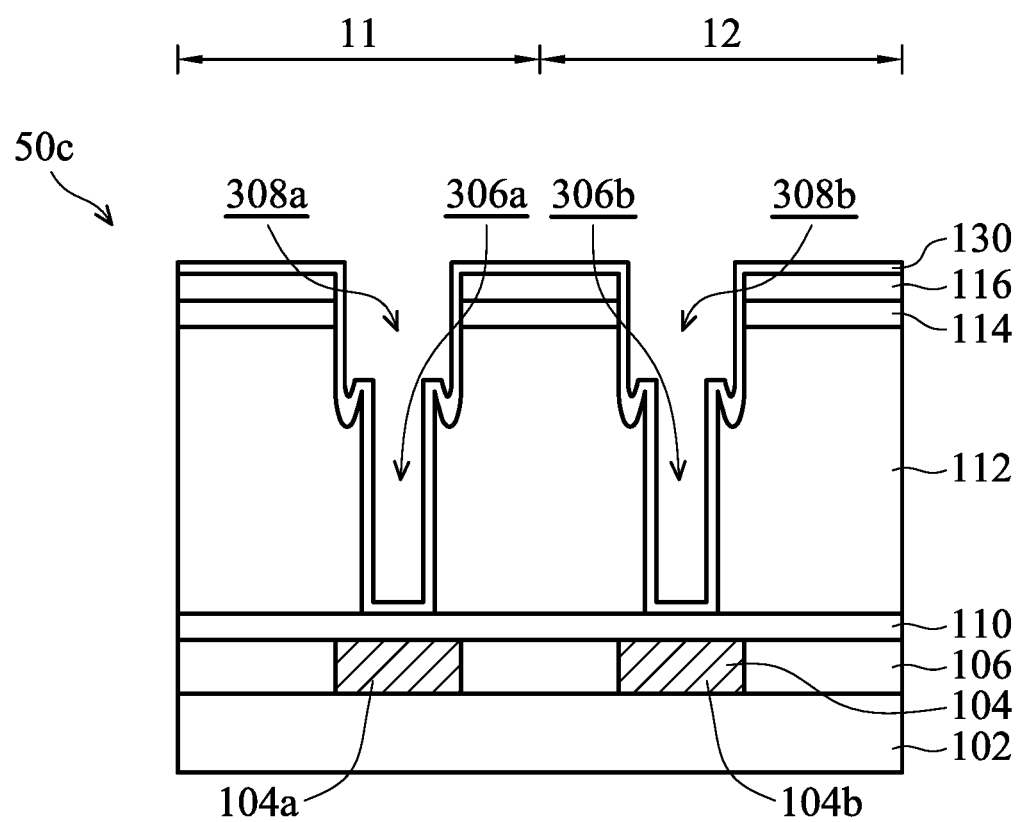

After the third etching process 350, the adhesion layer 130 is formed on sidewalls and the bottom surfaces of the via openings 306*a*, 306*b* and trench openings 308*a*, 308*b* as shown in FIG. 4B, in accordance with some embodiments of the disclosure.

The adhesion layer 130 includes a first portion 130*a* and a second portion 130*b* below the first portion 130*a*. The adhesion layer 130 is a discontinuous layer, and the first portion 130*a* is not connected to the second portion 130*b*. The first portion 130*a* is adjacent to the trench openings 308*a*, 308*b*, and the second portion 130*b* is adjacent to the via opening 306*a*, 306*b*. Since the bottoms of the first the trench openings 380*a*, 308*b* have a smooth V-shaped shape, the bottom of the first portion 130*a* of the adhesion layer 130 also has a smooth V-shaped shape.

Figure 4C:
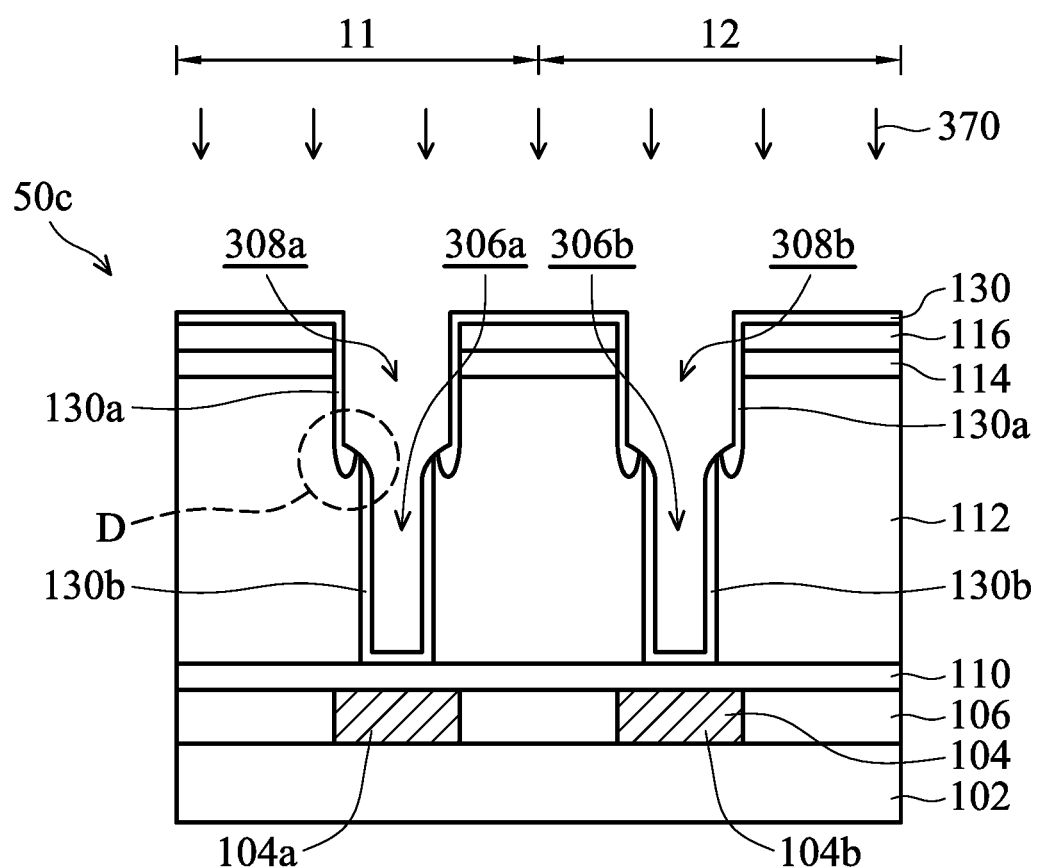
Figure 4C:
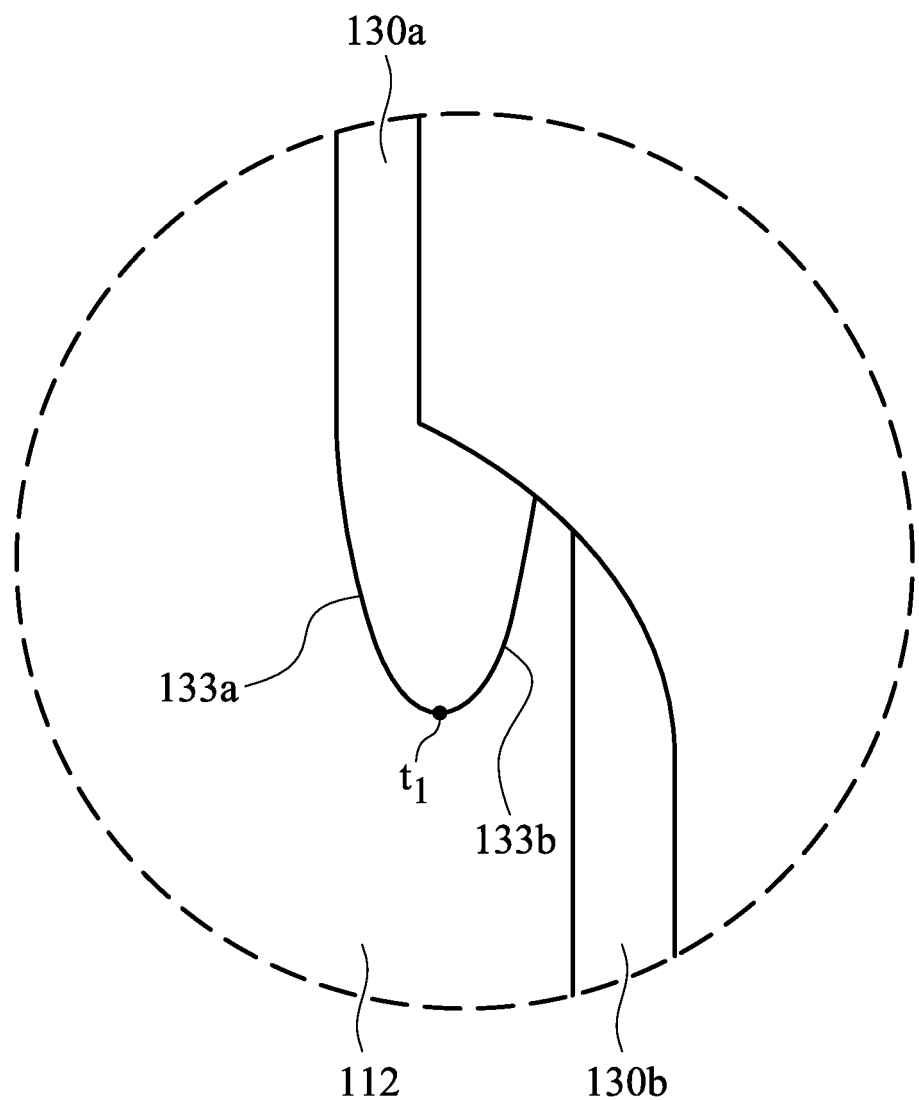

After forming the adhesion layer 130, a portion of the etch stop layer 110 is removed to expose the first metal layer 104*a* and the second metal layer 104*b* by the fourth etching process 370, as shown in FIG. 4C, in accordance with some embodiments of the disclosure. FIG. 4C' shows an enlarged representation of region D of FIG. 4C, in accordance with some embodiments of the disclosure.

As mentioned above, the corner regions are attached by the fourth etching process 370. As a result, the adhesion layer 130 becomes a discontinuous layer. The adhesion layer 130 includes a first portion 130*a* and a second portion 130*b* below the first portion 130*a*. The first portion 130*a* is adjacent to the trench openings 308*a*, 308*b*, and the second portion 130*b* is adjacent to the via openings 306*a*, 306*b*.

The bottom of the first portion 130*a* of the adhesion layer 130 has a smooth V-shaped shape. The extending tip $t_1$ is located at a lowest position of the a smooth V-shaped shape. A bottom of the first portion 130*a* of the adhesion layer 130 has a first rounded sidewall 133*a* connected to the extending tip $t_1$ and a second rounded sidewall 133*b* connected to the extending tip $t_1$, and the first rounded sidewall 133*a* and the second rounded sidewall 133*b* are symmetric in relation to the extending tip $t_1$.

Figure 4D:
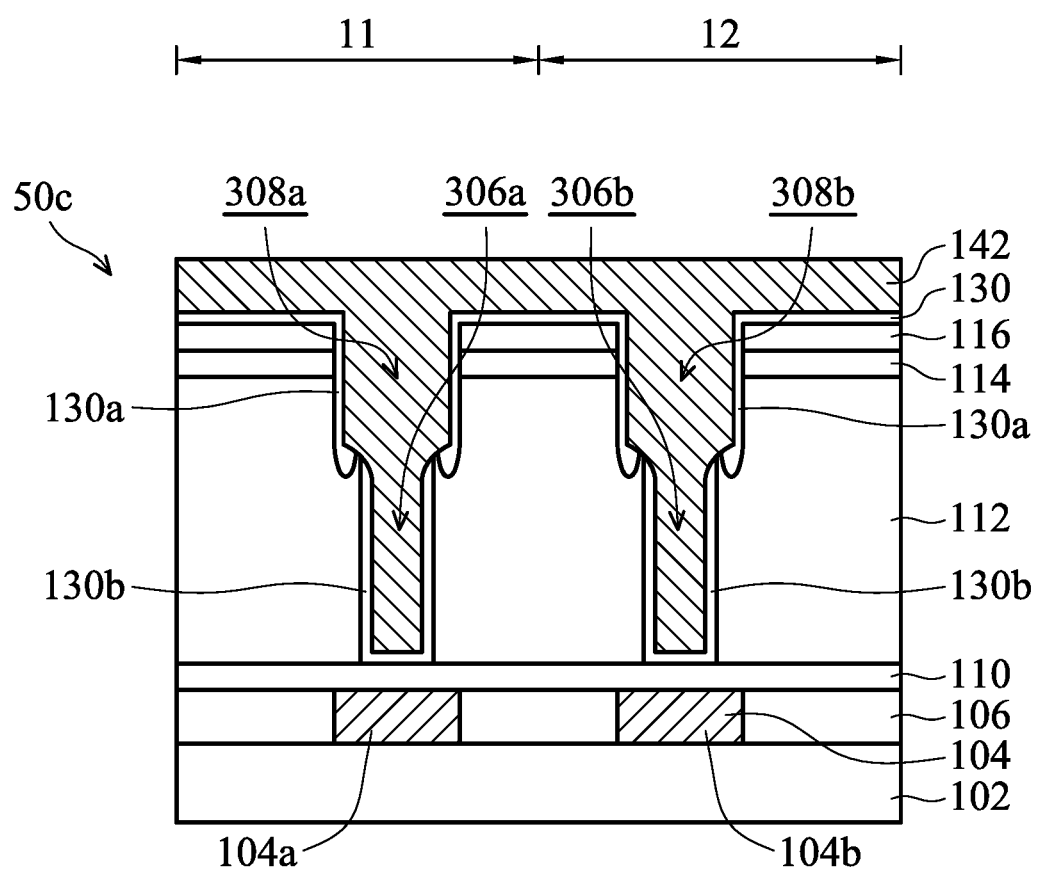

After the fourth etching process 370, the conductive feature 142 is formed in the trench openings 308*a*, 308*b*, the via openings 306*a*, 306*b* and on the hard mask layer 116, as shown in FIG. 4D, in accordance with some embodiments of the disclosure.

Figure 4E:
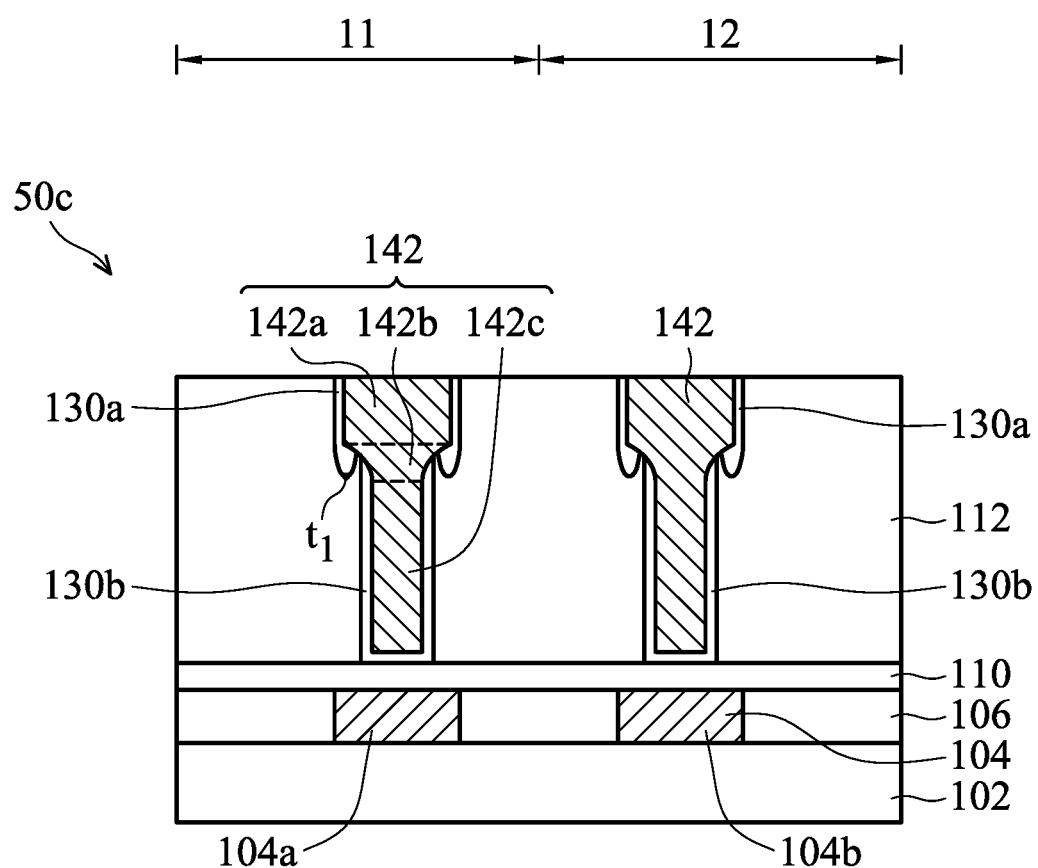

Afterwards, the antireflection layer 114, the hard mask layer 116 and some conductive feature 142 out of the trench openings 308*a*, 308*b* are removed, as shown in FIG. 4E, in accordance with some embodiments of the disclosure. In some embodiments, the antireflection layer 114 and hard mask layer 116 are removed by a chemical mechanical polishing (CMP) process.

The first portion 130*a* of the adhesion layer 130 has the extending tip $t_1$, and the extending tip $t_1$ is located at a position that is lower than a highest point of the via portion 142*b* of the conductive feature 142.

Embodiments for forming a semiconductor device structure and method for formation the same are provided. The semiconductor device structure includes a FinFET structure formed over a substrate, and an interconnect structure formed over the FinFET structure. The interconnect structure includes a dual damascene structure with a trench-via structure. A trench opening and a via opening are formed in a dielectric layer, and a conductive feature is filled into the trench opening and the via opening to form the trench-via structure.

An adhesion layer is formed on the trench-via structure before the first metal layer is exposed. The adhesion layer is a discontinuous layer and has an extending portion. The adhesion layer is configured to improve the adhesion between the dielectric layer and conductive feature, and prevent the trench from being over-etched. Therefore, the delamination problem and the shrinkage problem of the conductive feature are prevented. Furthermore, the performance of the semiconductor device structure is improved.

In some embodiments, a semiconductor device structure is provided. The semiconductor device structure includes a first metal layer formed over a substrate and a dielectric layer formed over the first metal layer. The semiconductor device structure further includes an adhesion layer formed in the dielectric layer and over the first metal layer and a second metal layer formed in the dielectric layer. The second metal layer is electrically connected to the first metal layer, a portion of the adhesion layer is formed between the second metal layer and the dielectric layer. The adhesion layer includes a first portion lining with a top portion of the second metal layer, and the first portion has an extending portion along a vertical direction.

In some embodiments, a semiconductor device structure is provided. The semiconductor device structure includes a first metal layer formed over a substrate and a dielectric layer formed over the first metal layer. The semiconductor device structure includes an adhesion layer formed in the dielectric layer and over the first metal layer and a second metal layer formed in the dielectric layer. The adhesion layer is formed between the second metal layer and the dielectric layer, and the second metal layer includes a via portion and a trench portion above the via portion. The adhesion layer includes a first portion adjacent to the trench portion of the second metal layer, the first portion has an extending tip, and the extending tip is located at a position which is lower than a highest point of the via portion of the second metal layer.

In some embodiments, a method for forming a semiconductor device structure is provided. The method includes forming a first metal layer over a substrate and forming an etch stop layer over the first metal layer. The method includes forming a dielectric layer over the etch stop layer and forming a trench opening and a via opening in the dielectric layer. The trench opening has an extending portion. The method includes forming an adhesion layer on sidewalls and bottom surfaces of the trench opening and the via opening and removing a portion of the etch stop layer directly above the first metal layer and removing a portion of the adhesion layer to expose a portion of the dielectric layer. The method includes filling a second metal layer in the via opening and the trench opening, and the second metal layer is electrically connected to the first metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first metal layer over a substrate;
an etch stop layer over the first metal layer;
a dielectric layer over the etch stop layer, the dielectric layer having a single continuous composition, the dielectric layer having a trench opening and a via opening, wherein the trench opening has an extending portion, a bottom surface of the extending portion extends toward the etch stop layer as the bottom surface extends from the via opening toward a sidewall of the trench opening;
an adhesion layer on sidewalls and bottom surfaces of the trench opening and the via opening, wherein the adhesion layer is discontinuous such that an exposed portion of the dielectric layer is exposed adjacent the extending portion; and
a second metal layer in the via opening and the trench opening, wherein the second metal layer is electrically connected to the first metal layer.

2. The device of claim 1, wherein the adhesion layer completely fills the extending portion.

3. The device of claim 1, wherein the second metal layer directly contacts the dielectric layer.

4. The device of claim 1, wherein a surface of the adhesion layer and a surface of the dielectric layer along a corner between the trench opening and the via opening forms a continuously sloping surface.

5. The device of claim 4, wherein the continuously sloping surface is a continuously curving surface.

6. The device of claim 1, wherein the adhesion layer in the extending portion extends lower than an upper surface of the adhesion layer along sidewalls of the via opening.

7. The device of claim 1, wherein a surface of the dielectric layer along a bottom of the trench opening is convex.

8. A semiconductor device structure, comprising:
a first metal layer over a substrate;
a dielectric layer over the first metal layer, the dielectric layer having a trench and a via opening in the dielectric layer, wherein a width of the trench is greater than a width of the via opening, wherein a bottom of the trench extends below an upper surface of a sidewall of the via opening forming a recess;
an adhesion layer in the trench and the via opening, a first portion of the adhesion layer being on a sidewall and bottom surfaces of the trench, a second portion of the adhesion layer being on a sidewall of the via opening, wherein the first portion of the adhesion layer completely fills the recess, wherein the first portion of the adhesion layer is disconnected from the second portion of the adhesion layer in a cross-sectional view, wherein a slanted sidewall of the dielectric layer extends between the first portion of the adhesion layer and the second portion of the adhesion layer; and
a second metal layer in the via opening and the trench, wherein the second metal layer is electrically connected to the first metal layer, wherein the second metal layer contacts the slanted sidewall.

9. The structure of claim 8, wherein the dielectric layer has a single continuous composition.

10. The structure of claim 8, wherein a surface of the dielectric layer extending from a sidewall of the trench toward the second portion of the adhesion layer is convex.

11. The structure of claim 10, wherein a highest point of the surface of the dielectric layer along a bottom of the trench is spaced apart from the second portion of the adhesion layer.

12. The structure of claim 8, wherein the second metal layer physically contacts the dielectric layer.

13. The structure of claim 8, wherein a bottom of the via opening is free of the adhesion layer.

14. The structure of claim 8, wherein a surface of the first portion of the adhesion layer, a surface of the dielectric layer, and a surface of the first portion of the adhesion layer forms a continuous curve sloping upwards away from the substrate.

15. A semiconductor device structure, comprising:
a dielectric layer over a substrate;
a trench opening and a via opening in the dielectric layer, wherein a sidewall of the via opening extends higher than a bottom of the trench to form a recess, wherein an upper portion of the sidewall of the via opening has a first slope and a lower portion of the sidewall of the via opening having a second slope, wherein the first slope is less than the second slope;
an adhesion layer on sidewalls and bottom surfaces of the trench opening and on sidewalls of the via opening, the adhesion layer completely filling the recess; and
a metal layer over the adhesion layer.

16. The structure of claim 15, wherein the metal layer directly contacts the dielectric layer.

17. The structure of claim 15 further comprising:
- a fin field effect transistor (FinFET) device over the substrate; and
- a contact structure electrically connected to a source/drain structure of the FinFET device, wherein the metal layer contacts the contact structure.

18. The structure of claim 15, wherein a bottom of the via opening is free of the adhesion layer.

19. The structure of claim 15, wherein a sidewall of the metal layer continually slopes downward from an upper surface of the dielectric layer toward the substrate.

20. The structure of claim 15, wherein the bottom of the trench is curved from a sidewall of the via to a sidewall of the trench.

* * * * *